(12) United States Patent
Wang et al.

(10) Patent No.: US 12,446,318 B2
(45) Date of Patent: Oct. 14, 2025

(54) DISPLAY SUBSTRATE, MANUFACTURING METHOD THEREOF AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Xiao Wang, Beijing (CN); Qi Sang, Beijing (CN); Yu Ma, Beijing (CN); Yan Yan, Beijing (CN); Weitao Chen, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/681,577

(22) PCT Filed: Feb. 20, 2023

(86) PCT No.: PCT/CN2023/077056
§ 371 (c)(1),
(2) Date: Feb. 6, 2024

(87) PCT Pub. No.: WO2023/169189
PCT Pub. Date: Sep. 14, 2023

(65) Prior Publication Data
US 2024/0363644 A1 Oct. 31, 2024

(30) Foreign Application Priority Data
Mar. 7, 2022 (CN) .......................... 202210215759.6

(51) Int. Cl.
*G09G 3/20* (2006.01)
*H10D 86/40* (2025.01)
*H10D 86/60* (2025.01)

(52) U.S. Cl.
CPC ............... *H10D 86/60* (2025.01); *G09G 3/20* (2013.01); *H10D 86/441* (2025.01); *G09G 2310/0286* (2013.01); *G09G 2370/00* (2013.01)

(58) Field of Classification Search
CPC ............ G06F 3/041; G09G 2300/0426; G09G 3/3677; G11C 19/287
See application file for complete search history.

(56) References Cited

U.S. PATENT DOCUMENTS

| 2013/0027280 | A1 | 1/2013 | Ogasawara et al. |
| 2017/0309242 | A1* | 10/2017 | Kim .................. G02F 1/133345 |
| 2022/0057667 | A1* | 2/2022 | Xiong ................. G02F 1/13454 |

FOREIGN PATENT DOCUMENTS

| CN | 103439844 A | 12/2013 |
| CN | 105161505 A | 12/2015 |

(Continued)

*Primary Examiner* — Sanjiv D. Patel
(74) *Attorney, Agent, or Firm* — HOUTTEMAN LAW, LLC

(57) ABSTRACT

A display substrate, a manufacturing method thereof and a display device are provided. The display substrate includes: a base substrate; a first signal transmission line and including first and second transmission sub-lines side by side in a same layer and electrically connected together; a first insulating layer on side of the first signal transmission line away from the base substrate; a second signal transmission line on side of the first insulating layer away from the base substrate and connected to the first transmission sub-line through a first via; a second insulating layer on a side of the second signal transmission line away from the base substrate; and a first connection member on a side of the second insulating layer away from the base substrate, connected to the second signal transmission line through a second via and to the second transmission sub-line through a third via.

20 Claims, 16 Drawing Sheets

FIG. 4

(56) References Cited

FOREIGN PATENT DOCUMENTS

| | | |
|---|---|---|
| CN | 108563082 A | 9/2018 |
| CN | 109976056 A | 7/2019 |
| CN | 110095889 A | 8/2019 |
| CN | 110581142 A | 12/2019 |
| CN | 211577626 U | 9/2020 |
| CN | 113189820 A | 7/2021 |
| CN | 113406830 A | 9/2021 |
| CN | 113937113 A | 1/2022 |
| CN | 217306504 A | 8/2022 |

* cited by examiner

DISPLAY SUBSTRATE, MANUFACTURING METHOD THEREOF AND DISPLAY DEVICE

TECHNICAL FIELD

The present disclosure relates to the field of display technology, in particular to a display substrate, a method for manufacturing a display substrate and a display device.

BACKGROUND

In a display substrate, a gate driving circuit is disposed in a non-display region, and includes a plurality of cascaded shift register units, which sequentially provide scanning signals to gate lines on the display substrate. Each shift register unit is also connected to a clock signal line, so that the shift register unit outputs a scanning signal under a control of a clock signal on the clock signal line. Therefore, a connection stability between the shift register unit and the clock signal line directly affects the output of the shift register unit.

SUMMARY

The present disclosure provides a display substrate, a manufacturing method thereof and a display device.

In a first aspect, the present disclosure provides a display substrate, including: a base substrate; a first signal transmission line on the base substrate and including a first transmission sub-line and a second transmission sub-line side by side in the same layer and electrically connected to each other; a first insulating layer on a side of the first signal transmission line away from the base substrate; a second signal transmission line on a side of the first insulating layer away from the base substrate and connected to the first transmission sub-line through a first via extending through the first insulating layer; a second insulating layer on a side of the second signal transmission line away from the base substrate; and a first connection member on a side of the second insulating layer away from the base substrate, connected to the second signal transmission line through a second via extending through the second insulating layer and connected to the second transmission sub-line through a third via extending through the first insulating layer and the second insulating layer.

In some embodiments, an orthographic projection of the second via on the base substrate is within an orthographic projection of the first via on the base substrate.

In some embodiments, an orthographic projection of the first via on the base substrate is within an orthographic projection of the second signal transmission line on the base substrate.

In some embodiments, the second signal transmission line includes: a conductive portion and a transmission portion connected to the conductive portion; the conductive portion extends along a length direction of the first transmission sub-line, and an extending direction of the transmission portion intersects with an extending direction of the conductive portion; the orthographic projection of the first via on the base substrate is within an orthographic projection of the conductive portion on the base substrate; and a size of the first via in a width direction of the conductive portion is 0.4 to 0.6 times of a width of the conductive portion, and a size of the second via in the width direction of the conductive portion is 0.2 to 0.5 times of the width of the conductive portion.

In some embodiments, the first connection member includes: a first connection portion, a second connection portion, and a first climbing portion connected therebetween, the first connection portion is opposite to the second signal transmission line, an orthographic projection of the second connection portion on the base substrate is opposite to a spacing region between the first transmission sub-line and the second transmission sub-line, the first connection portion includes: a first lap portion and a second climbing portion; the second climbing portion is inside the second via; the first lap portion is outside the second via and connects the first climbing portion with the second climbing portion; and wherein a slope angle of the first climbing portion is between 35° and 64°; a slope angle of the second climbing portion is between 35° and 62°.

In some embodiments, a depth of the first via is between 1500 Å and 4000 Å, a depth of the second via is between 3000 Å and 8000 Å, and a depth of the third via is between 3000 Å and 8000 Å.

In some embodiments, the second signal transmission line includes: a conductive portion and a transmission portion connected to the conductive portion; the conductive portion extends along a length direction of the first transmission sub-line, and an extending direction of the transmission portion intersects with an extending direction of the conductive portion; and an orthographic projection of the first via on the base substrate is a first projection, and an orthographic projection of the conductive portion on the base substrate is a second projection; and a part of the first projection exceeds the second projection and is on a side of the second projection close to the second transmission sub-line.

In some embodiments, the first connection member includes: a first connection portion, a second connection portion, and a first climbing portion connected therebetween, the first connection portion is opposite to the second signal transmission line, an orthographic projection of the second connection portion on the base substrate is opposite to a spacing region between the first transmission sub-line and the second transmission sub-line, the first connection portion includes: a first lap portion and a second climbing portion; the second climbing portion is inside the second via; the first lap portion is outside the second via and connects the first climbing portion with the second climbing portion; and wherein a slope angle of the first climbing portion is between 20° and 45°; a slope angle of the second climbing portion is between 20° and 42°.

In some embodiments, a depth of the first via is between 1500 Å and 4000 Å, a depth of the second via is between 1500 Å and 4000 Å, and a depth of the third via is between 3000 Å and 8000 Å.

In some embodiments, a size of the first via in a width direction of the conductive portion is 0.4 to 0.6 times a width of the conductive portion, and a size of the second via in the width direction of the conductive portion is 0.7 to 1.1 times the width of the conductive portion.

In some embodiments, a cross-sectional area of the first via and a cross-sectional area of the second via each gradually decrease in a direction approaching the base substrate; and wherein a slope angle of a wall of the first via is smaller than that of a wall of the second via.

In some embodiments, the second insulating layer has a thickness between 1000 Å and 4000 Å.

In some embodiments, the display substrate includes a plurality of first connection members and a plurality of second signal transmission lines; the first signal transmission line is connected to the plurality of first connection members; each first connection member is connected to one second signal transmission line through a plurality of second vias and is connected to the second transmission sub-line through a plurality of third vias; the plurality of third vias corresponding to a same first connection member are arranged along an extending direction of the first signal transmission line, and the plurality of second vias corresponding to a same first connection member are arranged along the extending direction of the first signal transmission line.

In some embodiments, an orthographic projection of the plurality of second vias corresponding to the same first connection member on the base substrate is within an orthographic projection of the corresponding first via on the base substrate.

In some embodiments, the display substrate includes a display region and a non-display region, the display region includes a plurality of sub-pixels, each of which is provided with a thin film transistor therein; and the first signal transmission line, the second signal transmission line and the first connection member are all in the non-display region, the first signal transmission line and a gate electrode of the thin film transistor are in the same layer, and the second signal transmission line and a source electrode and a drain electrode of the thin film transistor are in the same layer.

In some embodiments, each sub-pixel is further provided with a pixel electrode and a second connection member, the first insulating layer and the second insulating layer both cover the display region, the pixel electrode is between the first insulating layer and the base substrate, the second connection member is on a side of the second insulating layer away from the base substrate and is connected to the drain electrode of the thin film transistor through a fourth via extending through the second insulating layer and is connected to the pixel electrode through a fifth via extending through the first insulating layer and the second insulating layer, and the second connection member and the first connection member are in the same layer.

In some embodiments, the source electrode and the drain electrode of the thin film transistor are on a side of an active layer of the thin film transistor away from the base substrate, and are both in direct contact with the active layer; and orthographic projections of the source electrode and the drain electrode on the base substrate are both within an orthographic projection of the active layer on the base substrate.

In some embodiments, the second signal transmission line includes a lap portion; an orthographic projection of the lap portion on the base substrate is outside an orthographic projection of the first via on the base substrate, and the display substrate further includes a semiconductor redundant portion between the first insulating layer and the lap portion; the semiconductor redundant portion is formed in synchronization with the active layer of the thin film transistor.

In some embodiments, the display substrate includes a display region and a non-display region; the first signal transmission line and the second signal transmission line are both in the non-display region; and the display substrate further includes a plurality of shift register units in the non-display region; and the first signal transmission line is a clock signal line; the display substrate includes a plurality of second signal transmission lines, each of which is connected between the first signal transmission line and one shift register unit, and different second signal transmission lines are connected to different shift register units.

In some embodiments, the first signal transmission line further includes a plurality of connection portions connected between the first transmission sub-line and the second transmission sub-line.

In a second aspect, the present disclosure provides a method for manufacturing a display substrate, including: forming a pattern including a first signal transmission line on a base substrate, wherein the first signal transmission line includes a first transmission sub-line and a second transmission sub-line which are arranged side by side and electrically connected to each other; forming a first insulating layer on a side of the first signal transmission line away from the base substrate; forming a first via extending through the first insulating layer at a position corresponding to the first transmission sub-line; forming a pattern including a second signal transmission line on a side of the first insulating layer away from the base substrate, wherein the second signal transmission line is connected to the first transmission sub-line through the first via; forming a second insulating layer on a side of the second signal transmission line away from the base substrate; forming a second via extending through the second insulating layer at a position corresponding to the second signal transmission line, and forming a third via extending through the first insulating layer and the second insulating layer at a position corresponding to the second transmission sub-line; and forming a pattern including a first connection member on a side of the second insulating layer away from the base substrate, wherein the first connection member is connected to the second signal transmission line through the second via and is connected to the second transmission sub-line through the third via.

In some embodiments, the display substrate includes a display region and a non-display region; the display region includes a plurality of sub-pixels; the method further includes: forming a thin film transistor in each sub-pixel; and wherein the first signal transmission line, the second signal transmission line and the first connection member are all located in the non-display region; the first signal transmission line and a gate electrode of the thin film transistor are synchronously formed; and the second signal transmission line and a source electrode and a drain electrode of the thin film transistor are synchronously formed.

In some embodiments, the first insulating layer and the second insulating layer both cover the display region; the method further includes: forming a pixel electrode in each sub-pixel before forming the first insulating layer; forming a fourth via extending through the second insulating layer and a fifth via extending through the first insulating layer and the second insulating layer after the second insulating layer is formed; and forming a second connection member, wherein the second connection member is connected to the drain electrode of the thin film transistor through the fourth via and is connected to the pixel electrode through the fifth via; and wherein the second connection member is formed in synchronization with the first connection member.

In some embodiments, before forming the first via, the method further includes: forming a semiconductor layer; and the forming the first via includes: etching the semiconductor layer and the first insulating layer to form the first via.

In some embodiments, the second signal transmission line, the source electrode, the drain electrode and the active layer of the thin film transistor are formed by following steps: sequentially forming a source-drain metal layer and a photoresist layer on a side of the semiconductor layer away from the base substrate; performing an exposure process of a trapezoidal pattern for the photoresist layer and then performing a development process on the exposed photoresist layer to form at least a first photoresist portion and a second photoresist portion, wherein the first photoresist portion is located in a region where the active layer is to be formed and includes: a first portion corresponding to the source electrode, a second portion corresponding to the drain electrode, and a third portion located between the first portion and the second portion; the second photoresist portion is located in a region where the second signal transmission line is to be formed; each of thicknesses of the first portion, the second portion and the second photoresist portion is greater than that of the third portion; etching the source-drain metal layer and the semiconductor layer, to form the active layer and an intermediate electrode corresponding to the first photoresist portion, the second signal transmission line and a semiconductor redundant portion corresponding to the second photoresist portion; ashing the first photoresist portion and the second photoresist portion, to thin the first portion and the second portion of the first photoresist portion and the second photoresist portion and to remove the third portion of the first photoresist portion; and etching the intermediate electrode to form the source electrode and the drain electrode.

In a third aspect, the present disclosure provides a display device, including the above display substrate.

BRIEF DESCRIPTION OF DRAWINGS

The accompanying drawings, which are provided for further understanding of the present disclosure and constitute a part of this specification, are for explaining the present disclosure together with the embodiments of the present disclosure, but are not intended to limit the present disclosure. In the drawings.

DETAIL DESCRIPTION OF EMBODIMENTS

Figure 1:
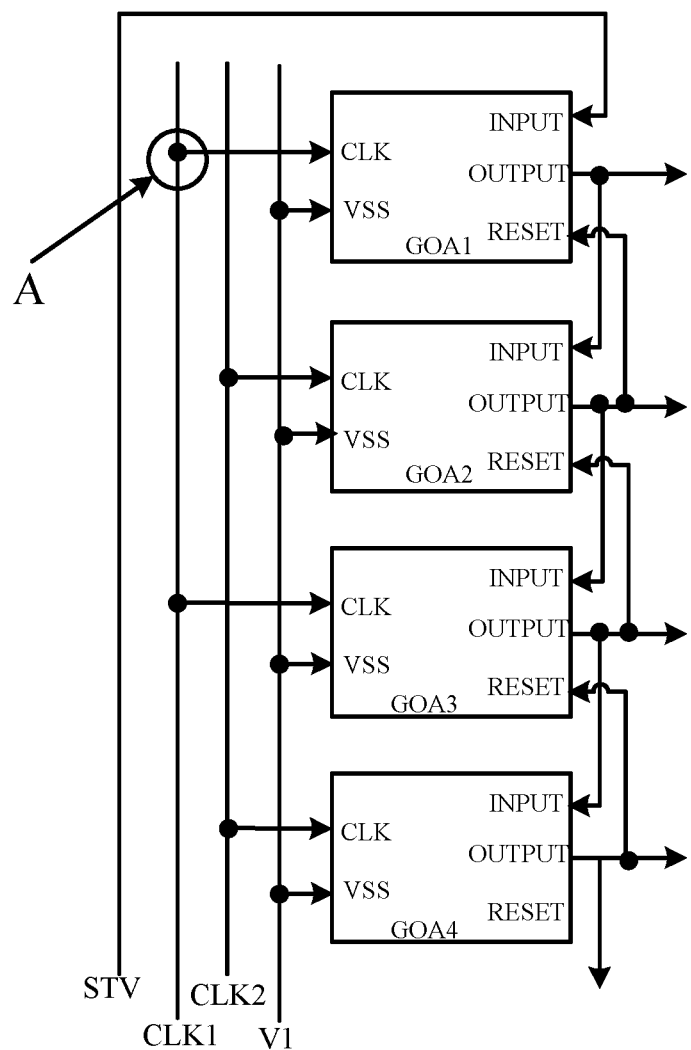
FIG. 1 is a schematic diagram of a gate driving circuit in an example.

In order to enable the objects, technical solutions and advantages of the embodiments of the present disclosure to be more apparent, the technical solutions in the embodiments of the present disclosure will be described clearly and completely with reference to the drawings in the embodiments of the present disclosure. It is obvious that the described embodiments are only a part, not all, of the embodiments of the present disclosure. All other embodiments, which can be derived by a person skilled in the art from the described embodiments of the present disclosure without making any creative effort, shall fall within the protection scope of the present disclosure.

Terms used herein to describe embodiments of the present disclosure are not intended to limit and/or define the scope of the present disclosure. For example, unless defined otherwise, technical or scientific terms used herein shall have the ordinary meaning as understood by one of ordinary skill in the art to which the present disclosure belongs. It should be understood that the terms "first", "second", and the like used in the present disclosure are not intended to indicate any order, quantity, or importance, but rather are used for distinguishing one element from another. The singular forms "a", "an", "the", or the like do not denote a limitation of quantity, but rather denote the presence of at least one, unless the context clearly dictates otherwise. The term of "comprising", "including", or the like, means that the element or item preceding the term contains the element or item listed after the term and its equivalent, but does not exclude other elements or items. The terms "upper", "lower", "left", "right", and the like are used only for indicating relative positional relationships, and when the absolute position of an object being described is changed, the relative positional relationships may also be changed accordingly.

In the following description, when an element or layer is referred to as being "on" or "connected to" another element or layer, the element or layer may be directly on, or directly connected to the another element or layer, or intervening elements or layers may be present therebetween. However, when an element or layer is referred to as being "directly on" or "directly connected to" another element or layer, there are no intervening elements or layers present therebetween. The term "and/or" includes any and all combinations of one or more of the associated listed items.

In the drawings, thicknesses of layers, films, panels, regions, etc. have been exaggerated for clarity. Exemplary embodiments are described herein with reference to cross-sectional views that are schematic diagrams of idealized embodiments. As such, deviations from shapes of the figures as a result of, for example, manufacturing techniques and/or tolerances, are to be expected. Thus, embodiments described herein should not be construed as being limited to the particular shapes of regions as illustrated herein but are to include deviations in shapes that result, for example, from manufacturing. For example, regions illustrated or described as flat may typically have rough and/or nonlinear features. Further, the illustrated sharp corners may be rounded. Thus, the regions illustrated in the figures are schematic in nature and their shapes are not intended to illustrate a precise shape of a region and are not intended to limit the scope of the claims.

FIG. 1 is a schematic diagram of a gate driving circuit in an example. As shown in FIG. 1, a gate driving circuit includes: a plurality of cascaded shift register units (such as GOA1, GOA2, GOA3 and GOA4 shown in FIG. 1), wherein an input terminal INPUT of a first stage shift register unit GOA1 is connected to a start signal line STV, an input terminal INPUT of each of a second stage shift register unit and shift register units after the second stage is connected to an output terminal OUTPUT of the previous stage shift register unit, and an output terminal OUTPUT of each of shift register units except the last stage is connected to a reset terminal RESET of the previous stage shift register unit. A first voltage terminal VSS of each stage of the shift register unit is connected to a first power line V1, which may be a low-level signal line. A clock signal terminal CLK of each stage of the shift register unit is connected to a clock signal line. For example, as shown in FIG. 1, a clock signal terminal CLK of each of odd-numbered stages of the shift register units is connected to a clock signal line CLK1, and a clock signal terminal CLK of each of even-numbered stages of the shift register units is connected to a clock signal line CLK2. The output terminal OUTPUT (for example, OUT1, OUT2, OUT3, OUT4 in FIG. 1) of each stage of shift register unit is connected to one gate line, and the shift register units in stages sequentially output scanning signals to the corresponding gate lines.

In an output stage of each shift register unit, a clock signal on the clock signal line connected to the shift register unit is in an active level state (e.g., a high level state), and the clock signal terminal CLK of the shift register unit is electrically connected to the output terminal OUTPUT, so that the shift register unit outputs the active level signal. Therefore, the connection stability between the shift register unit and the clock signal line is an important master factor for the shift register unit to output normally.

Figure 2A:
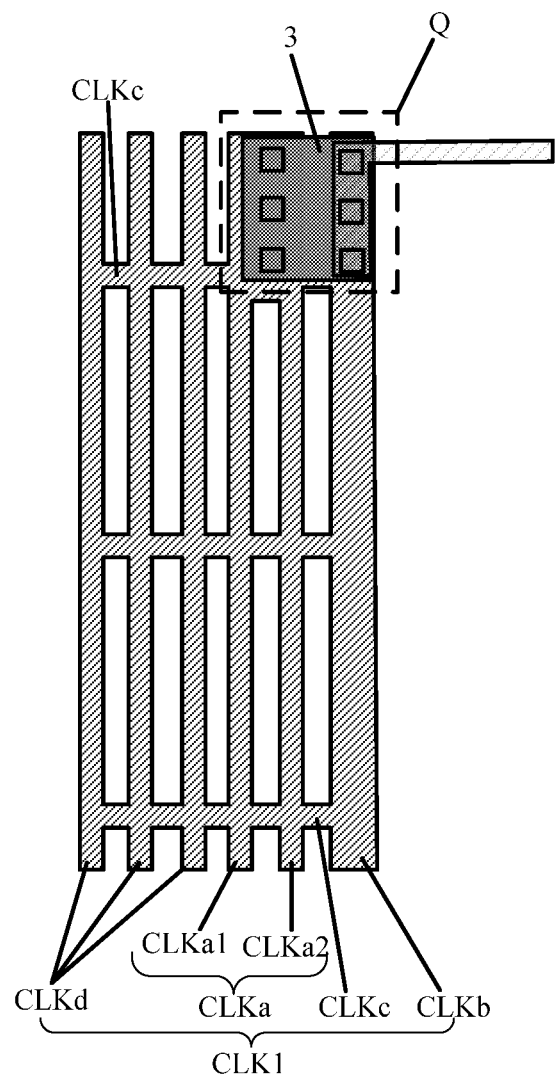
FIG. 2A is a schematic diagram of clock signal lines in an example.

The clock signal line may be a solid line or a grid structure and may be arranged according to an actual production process. FIG. 2A is a schematic diagram of clock signal lines in an example. As shown in FIG. 2A, the clock signal line includes a plurality of signal sub-lines and a plurality of connection portions CLKc, the plurality of signal sub-lines includes: a first signal sub-line CLKa, a second signal sub-line CLKb and a plurality of third signal sub-lines CLKd, wherein the first signal sub-line CLKa may be a continuous solid line, or as shown in FIG. 2A, includes two branch lines CLKa1 and CLKa2 connected together. The positions of CLKd and CLKa may be interchanged, i.e., one or more CLKd may be arranged between CLKa and CLKb. The plurality of signal sub-lines and the plurality of connection portions CLKc are arranged in the same layer and intersect with each other to form a grid structure. Therefore, when encapsulating the display panel, the grid clock signal line can transmit more light therethrough, thereby facilitating the curing of a frame sealing glue.

Figure 2B:
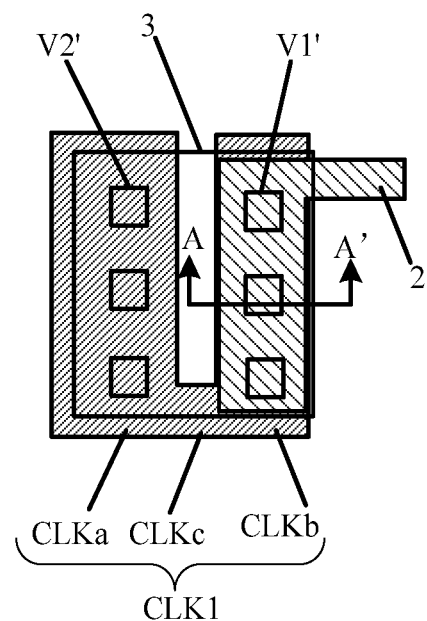
FIG. 2B is an enlarged view of a region Q in FIG. 2A.
Figure 3:
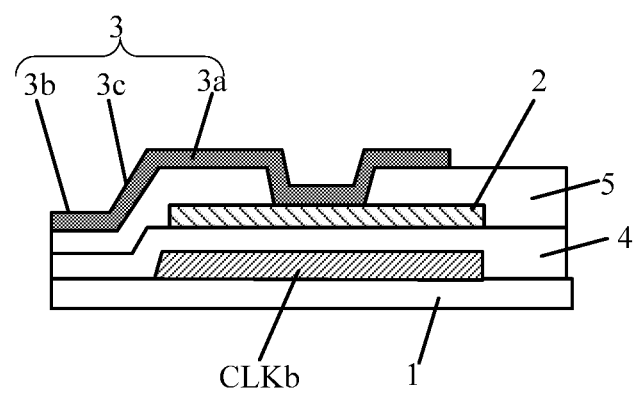
FIG. 3 is a cross-sectional view taken along a line A-A' of FIG. 2B.

FIG. 2B is an enlarged view of a region Q in FIG. 2A. A connection member 3 in FIG. 2B may be used as a connection node in a region A in FIG. 2A. FIG. 3 is a cross-sectional view taken along a line A-A' of FIG. 2B. As shown in FIGS. 2A to 3, the clock signal terminal CLK of the shift register unit is connected to the clock signal line CLK1 through a signal transmission line 2, wherein the first signal sub-line CLKa and the second signal sub-line CLKb of the clock signal line CLK1 are disposed in the same layer; a first insulating layer 4 is disposed on a side of the clock signal line CLK1 away from the base substrate 1; the signal transmission line 2 is located on a side of the first insulating layer 4 away from the base substrate 1, and an orthographic projection of the signal transmission line 2 on the base substrate 1 at least partially overlaps with an orthographic projection of the first signal sub-line CLKa on the base substrate 1. The signal transmission line 2 is connected to the clock signal line CLK1 through the connection member 3. As shown in FIGS. 1 and 3, a second insulating layer 5 is disposed on a side of the signal transmission line 2 away from the base substrate 1; the connection member 3 is located on a side of the second insulating layer 5 away from the base substrate 1, and the connection member 3 is connected to the signal transmission line 2 through a via V1' extending through the second insulating layer 5 and is connected to the clock signal line CLK1 through a via V2' extending through the first insulating layer 4 and the second insulating layer 5.

As shown in FIG. 3, a first portion 3a of the connection member 3 is located on a side of the signal transmission line 2 away from the base substrate 1, a second portion 3b of the connection member 3 is located at a spaced position between the first signal sub-line CLKa and the second signal sub-line CLKb. Since the signal transmission line 2 and the first signal sub-line CLKa each have a certain thickness, a climbing portion 3c is formed between the first portion 3a and the second portion 3b of the connection member 3, which causes the climbing portion 3c to be easily broken when static electricity is generated on the display substrate. For example, a top end of the climbing portion 3c is disconnected from the first portion 3a, and/or a bottom end of the climbing portion 3c is disconnected from the second portion 3b of the connection member 3, so that the signal on the clock signal line CLK1 cannot be transmitted to the signal transmission line 2 through the connection member 3, and the shift register unit cannot normally output the scan signal.

Figure 4:
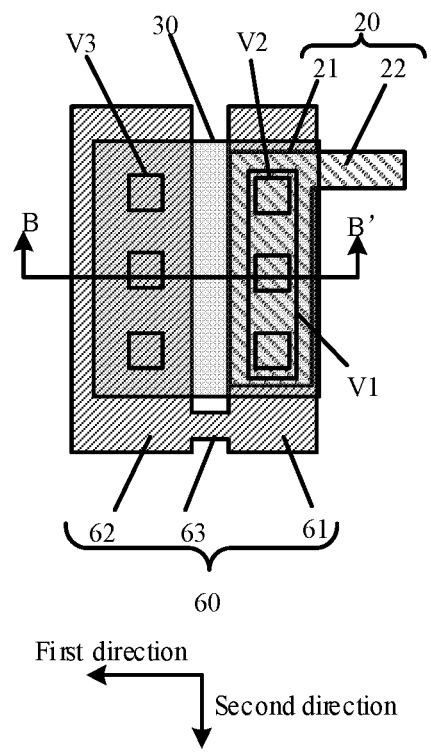
FIG. 4 is a plan view of a partial region of a display substrate according to embodiments of the present disclosure.
Figure 5A:
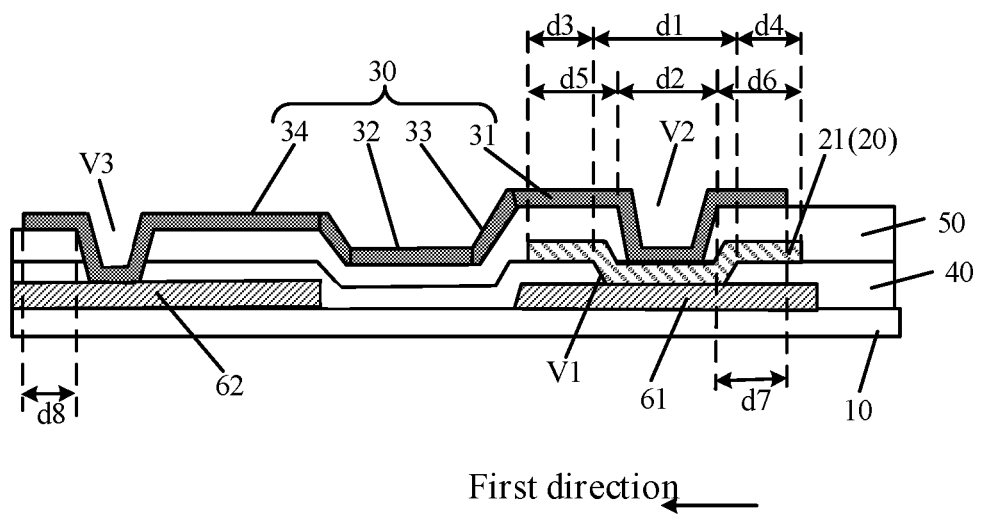
FIG. 5A is a cross-sectional view taken along a line B-B' of FIG. 4 according to embodiments of the present disclosure.
Figure 5B:
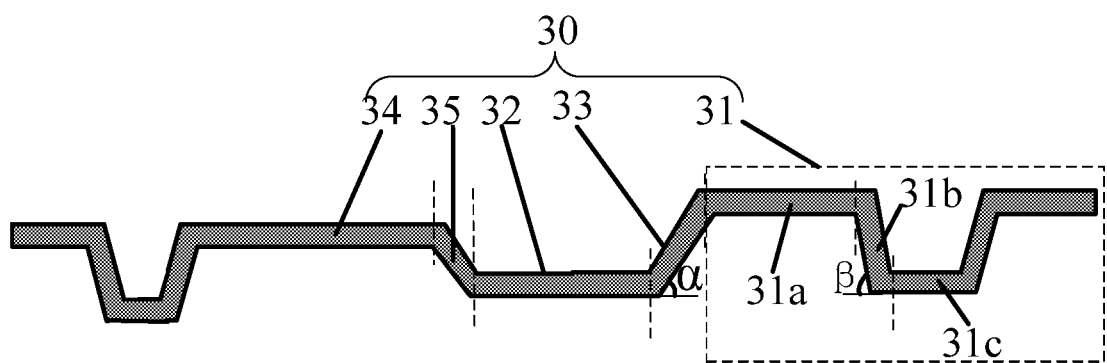
FIG. 5B is a schematic diagram of a first connection member in FIG. 5A.

In order to solve the above technical problem, the present disclosure provides a display substrate. FIG. 4 is a plan view of a partial region of a display substrate according to embodiments of the present disclosure. FIG. 5A is a cross-sectional view taken along a line B-B' of FIG. 4 according to embodiments of the present disclosure. FIG. 5B is a schematic diagram of a first connection member in FIG. 5A. As shown in FIGS. 4 to 5B, the display substrate includes a base substrate 10, and a first signal transmission line 60, a first insulating layer 40, a second signal transmission line 20, a second insulating layer 50, and a first connection member 30 disposed on the base substrate 10.

The base substrate 10 may be a hard substrate made of glass, or may be a flexible substrate made of PI or the like. The first signal transmission line 60 includes a first transmission sub-line 61 and a second transmission sub-line 62 disposed side by side in the same layer and electrically connected to each other. In addition, a plurality of connection portions 63 may be disposed between the first transmission sub-line 61 and the second transmission sub-line 62, and may be connected to the first transmission sub-line 61 and the second transmission sub-line 62 as an integrated structure. The first transmission sub-line 61 and the second transmission sub-line 62 may extend in the same or substantially the same direction.

It should be noted that "disposed in the same layer" in the present disclosure means that two structures are formed by the same material layer through a patterning process, and therefore, the two structures are in the same layer in a lamination relationship; but this does not mean that a distance between one of the two structures and the base substrate 10 is necessarily the same as that between the other structure and the base substrate 10.

The first insulating layer 40 is located on a side of the first signal transmission line 60 away from the base substrate 10, and is provided with a first via V1 at a position corresponding to the first transmission sub-line 61. A material of the first insulating layer 40 may include one or more of silicon nitride, silicon oxide, and silicon oxynitride.

The second signal transmission line 20 is located on a side of the first insulating layer 40 away from the base substrate 10, and is connected to the first transmission sub-line 61 through the first via V1.

The second insulating layer 50 is disposed on a side of the second signal transmission line 20 away from the base substrate 10, and a material thereof may include one or more of silicon nitride, silicon oxide, and silicon oxynitride. The second insulating layer 50 is provided with a second via V2 at a position corresponding to the second signal transmission line 20.

The first connection member 30 is disposed on a side of the second insulating layer 50 away from the base substrate 10, and the first connection member 30 is connected to the second signal transmission line 20 through the second via V2, and is connected to the second transmission sub-line 62 through a third via V3 extending through the first insulating layer 40 and the second insulating layer 50. Specifically, as shown in FIG. 5A, the first connection member 30 includes: a first connection portion 31, a second connection portion 32 and a third connection portion 34, the first connection portion 31 is disposed opposite to the second signal transmission line 20 and is located on a side of the second signal transmission line 20 away from the base substrate 10, the first connection portion 31 is connected to the second signal transmission line 20 through the second via V2; the second connection portion 32 is disposed opposite to a spaced region between the first transmission sub-line 61 and the second transmission sub-line 62, and the third connection portion 34 is located on a side of the second transmission sub-line 62 away from the base substrate 10 and connected to the second transmission sub-line 62 through the third via V3. In addition, since a thickness of a layer under the first connection portion 31 is large and a thickness of a layer under the second connection portion 32 is small, a first climbing portion 33 is formed between the first connection portion 31 and the second connection portion 32 of the first connection member 30, and similarly, a third climbing portion 35 is formed between the second connection portion 32 and the third connection portion 34. In the embodiments of the present disclosure, the two structures are "disposed opposite to" each other, which means that orthographic projections of the two structures on the base substrate 10 overlap with each other.

In the embodiments of the present disclosure, the first connection member 30 connects the second signal transmission line 20 with the second transmission sub-line 62 of the first signal transmission line 60, and the second signal transmission line 20 is also connected to the first transmission sub-line 61 of the first signal transmission line 60 through the first via V1, so that even if the first climbing portion 33 of the first connection member 30 is broken due to static electricity or other factors, the signal on the first signal transmission line 60 may be transmitted to the second signal transmission line 20 through the first via V1. When the first climbing portion of the first connection member 30 is not broken, the signal on the first signal transmission line 60 may be transmitted to the second signal transmission line 20 through the first via V1, and may also be transmitted to the second signal transmission line 20 through the first connection member 30, so that the connection reliability and the current resistance between the first signal transmission line 60 and the second signal transmission line 20 are ensured, that is, the first signal transmission line 60 and the second signal transmission line 20 can carry a larger input current compared with the prior art.

The number of the first signal transmission lines 60 and the second signal transmission lines 20 is not limited in the embodiments of the present disclosure, in some embodiments, one first signal transmission line 60 is included, a plurality of the second signal transmission lines 20 are included, and the first signal transmission line 60 is connected to the second signal transmission lines 20; alternatively, a plurality of the first signal transmission lines 60 and a plurality of the second signal transmission lines 20 are included; and each of the first signal transmission lines 60 is connected to the plurality of second signal transmission lines 20. It should be understood that regardless of the number of the first signal transmission lines 60 and the second signal transmission lines 20, each second signal transmission line 20 is connected to the first signal transmission line 60 through one first connection member 30, and different second signal transmission lines 20 are connected to different first connection members 30.

In one specific example, the display substrate includes a display region and a non-display region, the plurality of shift register units are provided in the non-display region, and the first signal transmission line 60, the second signal transmission line 20, and the first connection member 30 are all located in the non-display region. The number of the first signal transmission line 60 may be one, and the first signal transmission line 60 may serve as a clock signal line; a plurality of the second signal transmission lines 20 are included, each second signal transmission line 20 is connected between the first signal transmission line 60 and one shift register unit, and different second signal transmission lines 20 are connected to different shift register units. Alternatively, the plurality of the first signal transmission lines 60 are included, and different first signal transmission lines 60 are used as different clock signal lines; a plurality of the second signal transmission lines 20 are included, each second signal transmission line 20 is connected to one first signal transmission line 60 and one shift register unit, and different second signal transmission lines 20 are connected to different shift register units.

It should be noted that in the above example, the first signal transmission line 60 is used as the clock signal line, and the second signal transmission line 20 is used as the transmission line between the clock signal line and the shift register unit, which is only an exemplary illustration. In practical applications, the first signal transmission line 60 and the second signal transmission line 20 may also be used as other structures. For example, the first signal transmission line 60 may be used as a fanout line, and the second signal transmission line 20 may be used as a data line lead-out portion, wherein the data line lead-out portion is a portion of the data line extending into the non-display region, and the fanout line is connected between the data line lead-out portion and a data driving chip, thereby transmitting a data signal provided by the data driving chip to the corresponding data line. For another example, some of the plurality of first signal transmission lines 60 are used as clock signal lines, and the remaining first signal transmission lines 60 are used as fanout lines; each of some of the plurality of second signal transmission lines 20 is used as a transmission line between the clock signal line and the shift register unit, and the remaining second signal transmission lines 20 are used as data line lead-out portions.

As shown in FIG. 4, the second transmission sub-line 62 of the first signal transmission line 60 is located on a side of the first transmission sub-line 61 in a first direction, and both the first transmission sub-line 61 and the second transmission sub-line 62 extend in a second direction, for example, the first direction is perpendicular to the second direction. The second signal transmission line 20 may include a conductive portion 21 and a transmission portion 22 connected together as a one-piece structure, the conductive portion 21 extends in the second direction, an orthographic projection of the first via V1 on the base substrate 10 is within an orthographic projection of the conductive portion 21 on the base substrate, the conductive portion 21 is connected to the first transmission sub-line 61 through the first via V1, and the transmission portion 22 extends in the first direction. When the first signal transmission line 60 is used as the clock signal line, the transmission portion 22 may be connected between the conductive portion 21 and the clock signal terminal of the shift register unit.

As shown in FIGS. 4 and 5A, in some embodiments, an orthographic projection of the second via V2 on the base substrate 10 is located within an orthographic projection of the second signal transmission line 20 on the base substrate 10, so as to ensure the connection stability between the first connection member 30 and the second signal transmission line 20. Alternatively, the orthographic projection of the second via V2 on the base substrate 10 may also exceed the orthographic projection of the second signal transmission line 20 on the base substrate 10.

In some embodiments, the orthographic projection of the second via V2 on the base substrate 10 may be located within the orthographic projection of the first via V1 on the base substrate 10, which may ensure that a bottom of the second via V2 is located on a flat surface, thereby further improving the connection reliability of the first connection member 30 and the second signal transmission line 20.

As shown in FIGS. 4 and 5A, in some embodiments, the orthographic projection of the first via V1 on the base substrate 10 is located within an orthographic projection of the conductive portion 21 of the second signal transmission line 20 on the base substrate 10.

In some embodiments, a size d1 of the first via V1 in a width direction (i.e., the first direction) of the conductive portion 21 is 0.4 to 0.6 times a width of the conductive portion 21, and a size d2 of the second via V2 in the first direction is 0.2 to 0.5 times the width of the conductive portion 21.

In one example, the width of the conductive portion 21 is between 15 μm and 25 μm, the size d1 of the first via V1 in the first direction is between 8 μm and 12 μm, and the size d2 of the second via V2 in the first direction is between 4 μm and 8 μm. For example, the width of the conductive portion 21 is 19.6 μm, the size d1 of the first via V1 in the first direction is 9.6 μm, and the size d2 of the second via V2 in the first direction is 6.0 μm. The conductive portion 21 has a first edge and a second edge which are oppositely arranged and extend along the second direction, and a distance d3 between an orthographic projection of the first via V1 on the base substrate 10 and an orthographic projection of the first edge on the base substrate 10 may be equal to a distance d4 between the orthographic projection of the first via V1 on the base substrate 10 and an orthographic projection of the second edge on the base substrate 10. A distance d5 between an orthographic projection of the second via V2 on the base substrate 10 and the orthographic projection of the first edge on the base substrate 10 may be equal to a distance d6 between the orthographic projection of the second via V2 on the base substrate 10 and the orthographic projection of the second edge on the base substrate 10. For example, d5 and d6 may be between 3 μm and 6 μm. In this case, even if process fluctuation occurs in the manufacturing process, the orthographic projection of the second via V2 on the base substrate 10 can be ensured to be within the orthographic projection of the conductive portion 61 on the base substrate 10, and thus the stable connection of the first connection member 30 and the conductive portion can be ensured.

Shapes of the first via V1 and the second via V2 are not limited in the embodiments of the present disclosure. In one example, an orthographic projection of each of the first via V1 and the second via V2 on the base substrate 10 may be rectangular. In addition, in the embodiments of the present disclosure, each of the first connection members 30 may be connected to the second signal transmission line 20 through a plurality of second vias V2, and connected to the second transmission sub-line 62 of the first signal transmission line 60 through a plurality of third vias V3, thereby ensuring the connection reliability. In one example, the plurality of third vias V3 corresponding to the same first connection member 30 are arranged along an extending direction (i.e., the second direction) of the first signal transmission line 60, and the plurality of second vias V2 corresponding to the same first connection member 30 are arranged along the second direction.

Orthographic projections of the plurality of second vias V2 corresponding to the same first connection member 30 on the base substrate 10 are located in an orthographic projection of the same first via V1 on the base substrate 10, so that the process difficulty is reduced.

In some embodiments, as shown in FIGS. 4 and 5A, an orthographic projection of the second via V2 on the base substrate 10 is located within an orthographic projection of the first connection member 30 on the base substrate 10, and boundaries of the orthographic projection of the second via V2 on the base substrate 10 and the orthographic projection of the first connection member 30 on the base substrate 10 are not in contact with each other. For example, the first connection member 30 has a first side and a second side extending along the second direction, the first side is located on a side of the second via V2 away from the third via V3, the second side is located on a side of the third via V3 away from the second via V2, and a distance d7 between an orthographic projection of the first side on the base substrate 10 and the orthographic projection of the second via V2 on the base substrate 10 is between 5 μm and 8 μm. In this way, in the manufacturing process for the first connection member 30, even if there is the process fluctuation, the first connection member 30 can be ensured to completely cover the second via V2, thereby ensuring the stable connection between the first connection member 30 and the second signal transmission line 20. For example, the distance d7 between the orthographic projection of the first side on the base substrate 10 and the orthographic projection of the first via V1 on the base substrate 10 is 5 μm or 6 μm or 7 μm or 8 μm. Similarly, a distance d8 between an orthographic projection of the second side on the base substrate 10 and the orthographic projection of the third via V3 on the base substrate 10 is between 5 μm and 8 μm. In this way, in the manufacturing process for the first connection member 30, even if there is the process fluctuation, the first connection member 30 can be ensured to completely cover the third via V3, and the stable connection between the first connection member 30 and the second transmission sub-line 62 is ensured. For example, the distance d8 between the orthographic projection of the second side on the base substrate 10 and the orthographic projection of the third via V3 on the base substrate 10 is 5 μm or 6 μm or 7 μm or 8 μm.

In some embodiments, a thickness of the second insulating layer 50 is between 1000 Å and 4000 Å, e.g., the thickness of the second insulating layer 50 is between 1500 Å and 3500 Å, thereby reducing an angle of inclination of the first climbing portion 33 of the first connection member 30, reducing the likelihood that the first connection member 30 is broken. For example, the thickness of the second insulating layer 50 is 1500 Å or 2000 Å or 3000 Å or 3500 Å.

In some embodiments, a thickness of the first signal transmission line 60 may be between 1500 Å and 4000 Å, e.g., the thickness of the first signal transmission line 60 is 1500 Å or 2000 Å or 3000 Å or 3500 Å or 4000 Å. A thickness of the first insulating layer 40 may be between 1500 Å and 4000 Å, e.g., the thickness of the first insulating layer 40 is 1500 Å or 2000 Å or 3000 Å or 3500 Å or 4000 Å. A thickness of the second signal transmission line 20 may be between 1500 Å and 4000 Å, e.g., the thickness of the second signal transmission line 20 is 1500 Å or 2000 Å or 3000 Å or 3500 Å or 4000 Å.

In some embodiments, a difference between depths of the second via V2 and the first via V1 may be between 1500 Å and 4000 Å, a value of the sum of the depth of the first via V1 and the depth of the second via V2 minus a depth of the third via V3 may be between 1500 Å and 4000 Å, and a value of the depth of the third via V3 minus the depth of the second via V2 may be less than or equal to 2500 Å. The depth of the first via V1 may be the same as the thickness of the first insulation layer 40, and the depth of the third via V3 may be the sum of the thicknesses of the first insulation layer 40 and the second insulation layer 50; the depth of the second via V2 refers to a height difference between a portion of the first connection member 30 located on an upper surface of the second insulating layer 50 and a portion of the first connection member 30 falling into a bottommost portion of the second via V2. Optionally, the depth of the first via V1 may be between 1500 Å and 4000 Å, the depth of the second via V2 may be between 3000 Å and 8000 Å, and the depth of the third via V3 may be between 3000 Å and 8000 Å, thereby reducing a slope at each position of the first connection member 30.

As shown in FIGS. 5A and 5B, the first connection portion 31 of the first connection member 30 may specifically include: a first lap portion 31a, a second climbing portion 31b and a first flat portion 31c, wherein the second climbing portion 31b and the first flat portion 31c are all located within the second via V2. The second signal transmission line 20 includes a first contact portion located within the first via V1 and in direct contact with the first transmission sub-line 61; the first contact portion is located at the bottom of the first via V1; the first flat portion 31c is a portion of the first connection member 30 in direct contact with the first contact portion. The first flat portion 31c is substantially flat compared to the second climbing portion 31b. The first lap portion 31a is located outside the second via V2, and connects the first climbing portion 33 and the second climbing portion 31b. A slope angle α of the first climbing portion 33 is between 35° and 64°; a slope angle β of the second climbing portion 31b is between 35° and 62°. The slope angle of the first climbing portion 33/the second climbing portion 31b refers to an angle between a line connecting a climbing start point and a climbing end point of the first climbing portion 33/the second climbing portion 31b and a plane where the base substrate 10 is located; that is, a tangent of the slope angle of the first climbing portion 33/the second climbing portion 31b is: a ratio of a size of the first slope 33/the second slope 31b in a vertical direction (i.e., the direction perpendicular to the base substrate 10) to a size of the first slope 33/the second slope 31b in the first direction. The climbing start point is an end close to the base substrate 10, and the climbing end point is an end away from the base substrate 10.

When only the first insulating layer 40, the second insulating layer 50 and the second signal transmission line 20 are between the first lap portion 31a and the first transmission sub-line 61, the tangent of the slope angle of the first climbing portion 33 is: (a thickness of the first transmission sub-line 61+a thickness of the second signal transmission line 20)/a size of the first climbing portion 33 in the first direction; the tangent of the slope angle of the second climbing portion 31b is: (a thickness of the first insulating layer 40+a thickness of the second insulating layer 50)/a size of the first climbing portion 33 in the first direction.

The sizes of the first climbing portion 33 and the second climbing portion 31b in the first direction are related to an etching process. For example, under a certain etching process, the size of the first climbing portion 33 in the first direction and the size of the second climbing portion 31b in the first direction are both 4000 Å, and thicknesses of the first transmission sub-line 61, the second signal transmission line 20, the first insulating layer 40 and the second insulating layer 50 are all 1500 Å, then $\tan \alpha = (1500+1500)/4000$, $\alpha = 36.9°$; $\tan \beta = (1500+1500)/4000$, $\beta = 36.9°$. For another example, the size of the first climbing portion 33 in the first direction and the size of the second climbing portion 31b in the first direction are both 4000 Å, the thicknesses of the first transmission sub-line 61, the second signal transmission line 20, and the first insulating layer 40 are all 4000 Å, and the thickness of the second insulating layer 50 is 3500 Å, then $\tan \alpha = (4000+4000)/4000$, $\alpha = 63.4°$; $\tan \beta = (3500+4000)/4000$, $\beta = 61.9°$.

Figure 5C:
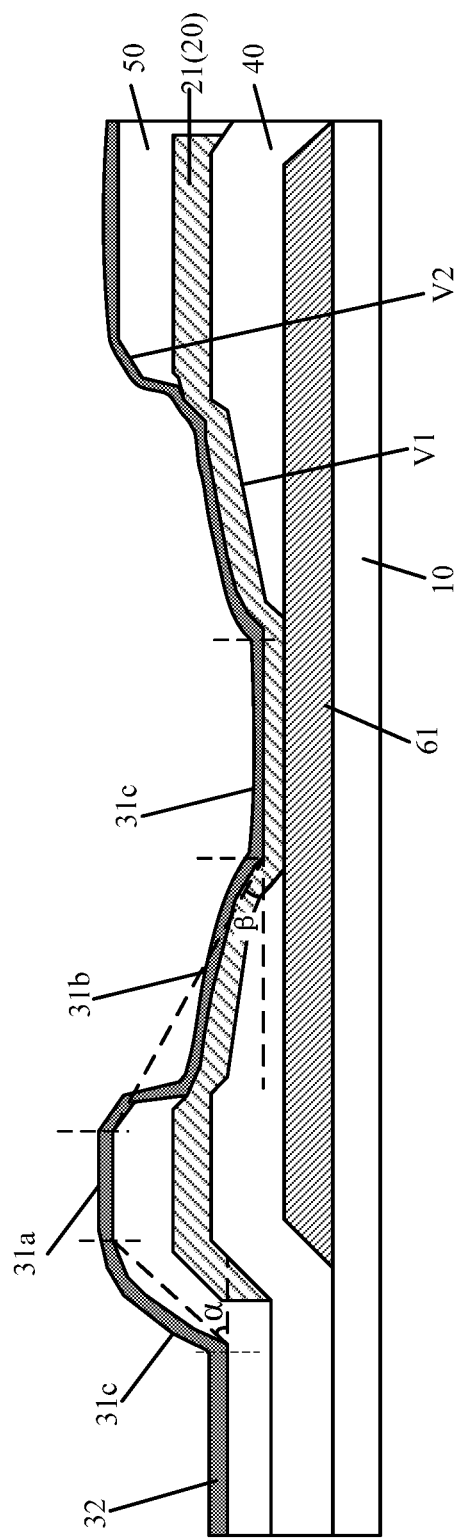
FIG. 5C is a partial cross-sectional view taken along a line B-B' of FIG. 4 according to other embodiments of the present disclosure.

FIG. 5C is a partial cross-sectional view taken along a line B-B' of FIG. 4 according to other embodiments of the present disclosure. As shown in FIG. 5C, in some examples, due to the limitation of the process condition, walls of the first via V1 and the second via V2 are not in a regular inclined state as in FIG. 5A, and thus the second climbing portion 31B is not in the regular inclined state, but has a concave-convex curved shape. In this case, the slope angle of the first climbing portion 33/the second climbing portion 31B may still be regarded as the angle between the line connecting the climbing start point and the climbing end point of the first climbing portion 33/the second climbing portion 31b and the plane where the base substrate 10 is located.

In addition, in some examples, as shown in FIG. 5C, in a direction approaching the base substrate 10, a cross-sectional area of the first via V1 in the first insulating layer 40 is gradually reduced, a cross-sectional area of the second via V2 in the second insulating layer 50 is gradually reduced, and the slope angle of the wall of the first via V1 is smaller than that of the wall of the second via V2. That is, by comparing the first via V1 with the second via V2, the wall of the first via V1 is gentler, and the wall of the second via V2 is steeper. It should be noted that the slope angle of the wall of the via is an angle between a line connecting a bottom end and a top end of the wall and the base substrate 10. The wall of the first via V1 has a smaller slope angle, so that the likelihood that the first connection member 30 is broken can be further reduced, and the film formation uniformity of the first connection member 30 is advantageously improved.

Figure 6:
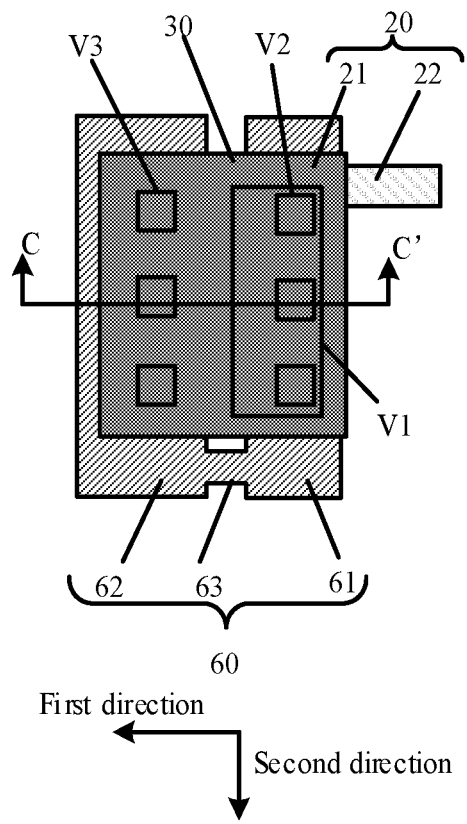
FIG. 6 is a plan view of a partial region of a display substrate according to other embodiments of the present disclosure.
Figure 7:
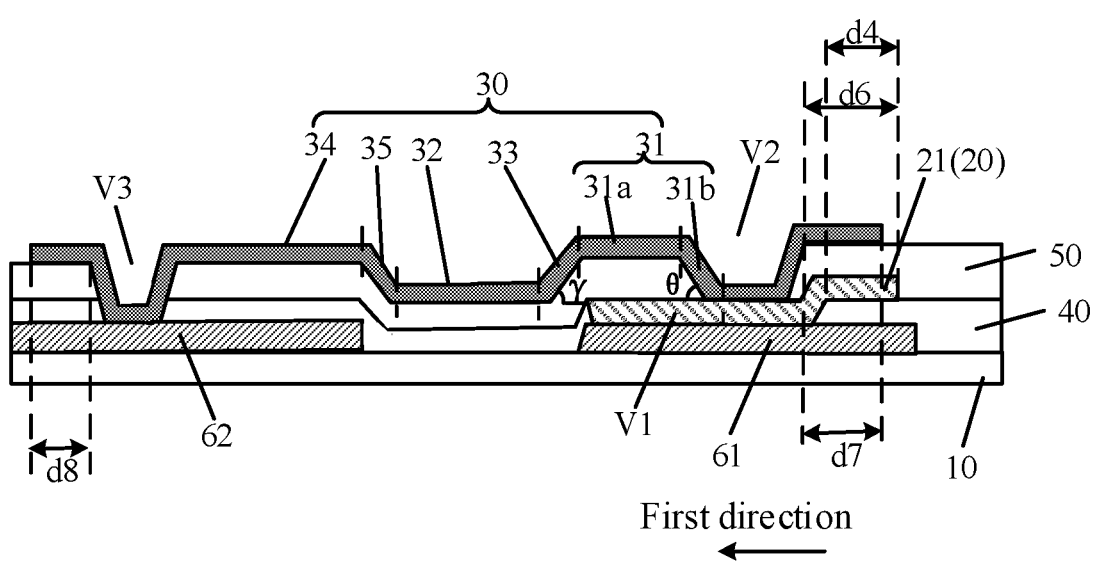
FIG. 7 is a cross-sectional view taken along a line C-C' of FIG. 6.

FIG. 6 is a plan view of a partial region of a display substrate according to other embodiments of the present disclosure. FIG. 7 is a cross-sectional view taken along a line C-C' of FIG. 6. The structure in FIG. 6 is substantially similar to that shown in FIG. 5A, except that a coverage of the orthographic projection of the first via V1 on the base substrate 10 is different. Specifically, the orthographic projection of the first via V1 on the base substrate 10 is denoted as a first projection, and an orthographic projection of the conductive portion 21 of the second signal transmission line 20 on the base substrate 10 is denoted as a second projection. As shown in FIG. 7, a part of the first projection exceeds the second projection, and is located on a side of the second projection close to the second transmission sub-line 62. In this case, at least a portion of the conductive portion 21 close to the third via V3 may be located in the first via V1, thereby reducing a climbing height of the climbing portion 33 and further reducing the likelihood that the first connection member 30 is broken.

In the embodiments shown in FIGS. 6 to 7, the difference between the depths of the second via V2 and the first via V1 may be less than 2500 Å, the sum of the depth of the first via V1 and the depth of the second via V2 may be substantially equal to the depth of the third via V3, and a value of the depth of the third via V3 minus the depth of the second via V2 may be between 1500 Å and 4000 Å. The depth of the first via V1 may be the same as the thickness of the first insulating layer 40, the depth of the second via V2 may be the same as the thickness of the second insulating layer 50, and the depth of the third via V3 may be the sum of the thicknesses of the first and second insulating layers 40 and 50. Optionally, the depth of the first via V1 is between 1500 Å and 4000 Å, the depth of the second via V2 is between 1500 Å and 4000 Å, and the depth of the third via V3 is between 3000 Å and 8000 Å, thereby reducing a slope at each position of the first connection member 30.

Like in FIG. 5A, the first connection member 30 includes: the first connection portion 31, the second connection portion 32, the third connection portion 34, and the first climbing portion 33; the first connection portion 31 may specifically include: the first lap portion 31*a* and the second climbing portion 31*b*, wherein the second climbing portion 31*b* is located inside the second via V2, and the first lap portion 31*a* is located outside the second via V2 and connects the first climbing portion 33 and the second climbing portion 31*b*. Unlike in FIG. 5A, a slope angle $\gamma$ of the first climbing portion 33 in FIG. 7 is smaller than the slope angle $\alpha$ of the first climbing portion 33 in FIG. 5B, and a slope angle $\theta$ of the second climbing portion 31*b* in FIG. 7 is smaller than the slope angle $\beta$ of the second climbing portion 31*b* in FIG. 5B. Specifically, in FIG. 7, the slope angle $\gamma$ of the first climbing portion 33 is between 20° and 45°; the slope angle $\theta$ of the second climbing portion 31*b* is between 20° and 42°.

When only the second insulating layer 50 and the second signal transmission line 20 are between the first lap portion 31*a* and the first transmission sub-line 61, the tangent of the slope angle $\gamma$ of the first climbing portion 33 is: (the thickness of the first transmission sub-line 61+the thickness of the second signal transmission line 20—the thickness of the first insulating layer 40)/the size of the first climbing portion 33 in the first direction; the tangent of the slope angle $\theta$ of the second climbing portion 31*b* is: the thickness of the second insulating layer 50/the size of the first slope 33 in the first direction.

For example, under an etching process, the size of the first climbing portion 33 in the first direction and the size of the second climbing portion 31*b* in the first direction are both 4000 Å; the thicknesses of the first transmission sub-line 61, the second signal transmission line 20, the first insulating layer 40, the second insulating layer 50 are all 1500 Å, then the tangent of the slope angle $\gamma$ of the first climbing portion 33 in FIG. 7 is tan $\gamma$=1500/4000, $\alpha$=20.56°; the tangent of the slope angle $\theta$ of the second climbing portion 31*b* is tan $\theta$=1500/4000, and $\theta$=20.56°. For another example, the size of the first climbing portion 33 in the first direction and the size of the second climbing portion 31*b* in the first direction are both 4000 Å; the thicknesses of the first transmission sub-line 61, the second signal transmission line 20, and the first insulating layer 40 are all 4000 Å, and the thickness of the second insulating layer 50 is 3500 Å, then the tangent of the slope angle $\gamma$ of the first climbing portion 33 is tan $\gamma$=(4000+4000−4000)/4000, $\gamma$=45°, and the tangent of the slope angle $\theta$ of the second climbing portion 31*b* is tan $\theta$=3500/4000, $\theta$=41.18°.

In FIG. 7, the size of the first via V1 in the first direction is 0.4 to 0.6 times the width of the conductive portion 21, and the size of the second via V2 in the first direction is 0.7 to 1.1 times the width of the conductive portion 21. In one example, the width of the conductive portion 21 is between 15 μm and 25 μm, the size of the first via V1 in the first direction is between 17.6 μm and 20.6 μm, and the size of the second via V2 in the first direction is between 4 μm and 8 μm. For example, the width of the conductive portion 21 is 19.6 μm, the size of the first via V1 in the first direction is 17.6 μm or 18 μm or 19 μm or 20 μm or 20.6 μm, and the size of the second via V2 in the first direction is 6.0 μm.

In the embodiments shown in FIGS. 6 and 7, the conductive portion 21 has a first edge and a second edge extending along the second direction, the first edge is close to the second via V2, the second edge is close to the third via V3, a distance between an orthographic projection of the first edge on the base substrate 10 and an orthographic projection of the second via V2 on the base substrate 10 is the above distance d6, and d6 is between 3 μm and 6 μm. In this case, even if the process fluctuation occurs during the manufacturing process, it can be ensured that the orthographic projection of the second via V2 on the base substrate 10 is located within the orthographic projection of the conductive portion 21 on the base substrate 10, thereby ensuring the stable connection of the first connection member 30 and the conductive portion 21.

In addition, for the embodiments shown in FIGS. 6 and 7, morphologies of the first via V1 and the second via V2 may also be set as follows: in the direction approaching the base substrate 10, the cross-sectional area of the first via V1 and the cross-sectional area of the second via V2 are both gradually reduced. In addition, the slope angle of the wall of the first via V1 is smaller than that of the wall of the second via V2, thereby further reducing the likelihood that the first connection member 30 is broken.

Figure 8:
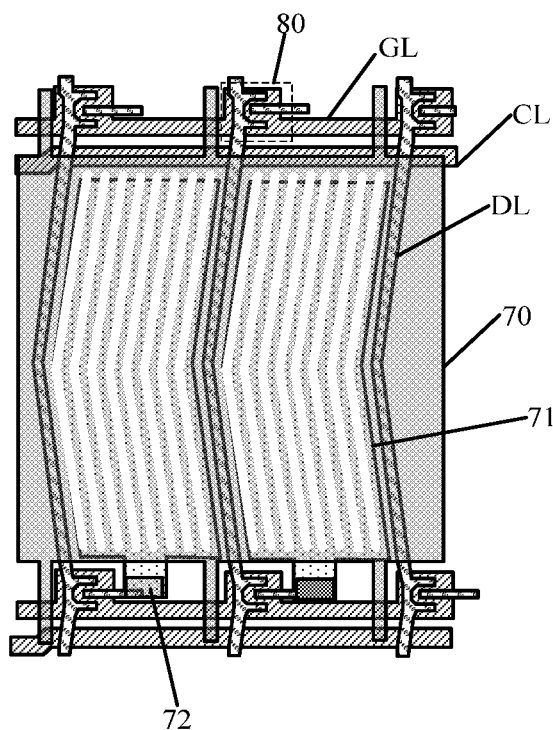
FIG. 8 is a partial plan view of a display region of a display substrate according to embodiments of the present disclosure.
Figure 9:
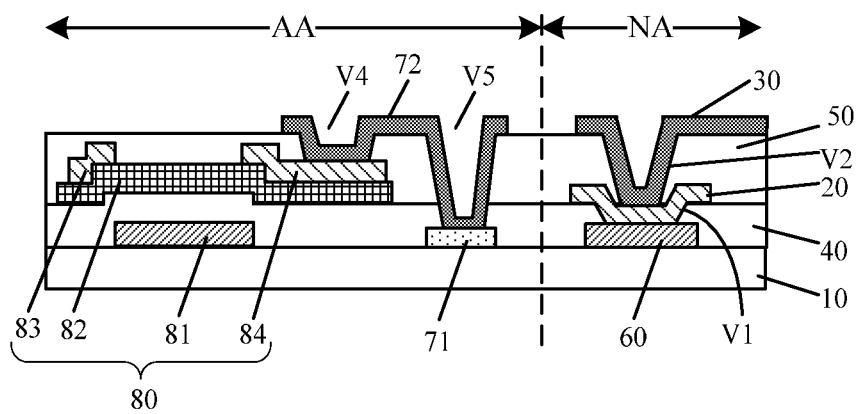
FIG. 9 is a cross-sectional view of a display substrate according to embodiments of the present disclosure.

FIG. 8 is a partial plan view of a display region of a display substrate according to embodiments of the present disclosure. FIG. 9 is a cross-sectional view of a display substrate according to embodiments of the present disclosure. Only a part of a structure of the display region and the non-display region is schematically illustrated in FIG. 9. As shown in FIGS. 8 and 9, a plurality of gate lines GL and a plurality of data lines DL are disposed in the display region AA of the display substrate, and the plurality of gate lines GL and the plurality of data lines DL intersect with each other, so that a plurality of sub-pixels are defined in the display region AA, and each sub-pixel is provided with a thin film transistor 80, a pixel electrode 71, and the like. The thin film transistor 80 includes a gate electrode 81, an active layer 82, a source electrode 83, and a drain electrode 84; the active layer 82 is opposite to the gate electrode 81 and is insulated and separated from the gate electrode 81, and the active layer 82 includes: a source contact region, a drain contact region, and a channel region therebetween, wherein the source electrode 83 is in contact with the source contact region, the drain electrode 84 is in contact with the drain contact region, and the source electrode 83 of the thin film transistor 80 is electrically connected to the data line DL and the drain electrode 84 is electrically connected to the pixel electrode 71.

In some embodiments, as shown in FIG. 9, the first insulating layer 40 and the second insulating layer 50 both cover the display region AA and the non-display region NA, the gate electrode 81 of the thin film transistor 80 and the gate line GL may have a one-piece structure, which is located between the first insulating layer 40 and the base substrate 10; the active layer 82 of the thin film transistor 80 is located on a side of the first insulating layer 40 away from the base substrate 10, and the source electrode 83 and the drain electrode 84 are located on a side of the active layer 82 away from the base substrate 10.

The pixel electrode 71 is located between the first insulating layer 40 and the base substrate 10; a second connection member 72 is further disposed in the sub-pixel, and is located on a side of the second insulating layer 50 away from the base substrate 10, and is connected to the drain electrode 84 of the thin film transistor 80 through a fourth via V4 extending through the second insulating layer 50, and is connected to the pixel electrode 71 through a fifth via V5 extending through the first insulating layer 40 and the second insulating layer 50.

The display substrate further includes a plurality of common electrodes 70 and a plurality of common electrode lines CL, wherein the common electrodes 70 are located in the display region and located on a side of the second insulating layer 50 away from the base substrate 10, and the common electrodes 70 have a plurality of slits. The common electrode lines CL may be disposed in the same layer as the gate lines GL, and the extending directions of the common electrode lines CL and the gate lines GL are substantially the same. Each common electrode 70 is connected to the corresponding common electrode line CL through a sixth via (not shown) extending through the first and second insulating layers 40 and 50.

In some embodiments, the first signal transmission line 60 is disposed in the same layer as the gate electrode 81 of the thin film transistor 80, and the material thereof may include one or more of molybdenum, aluminum, and copper. The second signal transmission line 20 is disposed in the same layer as the source electrode 83 and the drain electrode 84 of the thin film transistor 80, and the material thereof may include one or more of molybdenum, aluminum, and copper. The first connection member 30, the second connection member 72 and the common electrodes 70 are disposed in the same layer, and may be made of a transparent conductive material such as indium tin oxide (ITO).

Figure 10:
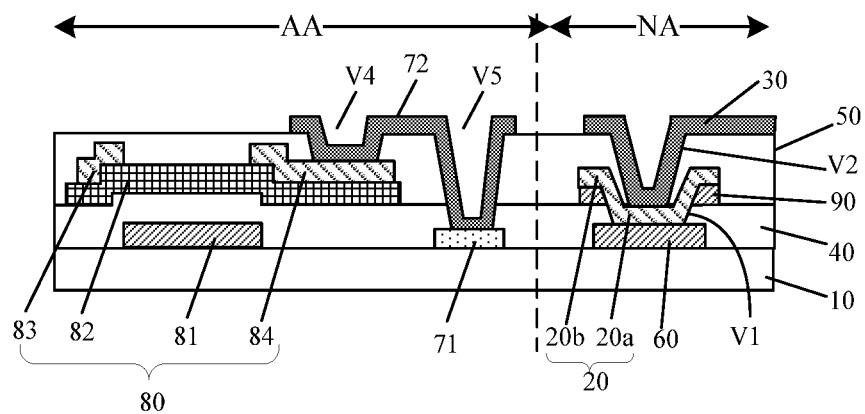
FIG. 10 is a cross-sectional view of a display substrate according to other embodiments of the present disclosure.

FIG. 10 is a cross-sectional view of a display substrate according to other embodiments of the present disclosure. Only a part of a structure of the display region and the non-display region is schematically illustrated in FIG. 10. The structure shown in FIG. 10 is substantially similar to the structure shown in FIG. 9, except that in FIG. 10, a semiconductor redundant portion 90 is further provided on a side of the first insulating layer 40 away from the base substrate 10. Specifically, the second signal transmission line 20 includes a portion 20*a* located inside the first via V1 and a lap portion 20*b* located outside the first via V1; an orthographic projection of the lap portion 20*b* on the base substrate 10 is located outside the orthographic projection of the first via V1 on the base substrate 10; the semiconductor redundant portion 90 is located between the first insulating layer 40 and the lap portion 20*b*, and is formed in synchronization with the active layer 82 of the thin film transistor 80. In addition, the source electrode 83 and the drain electrode 84 of the thin film transistor 80 are both in direct contact with the active layer 82 (the "direct contact" here means that no other insulating layer is provided between the layer where the source electrode 83 and the drain electrode 84 are located and the active layer 82, so that the source electrode 83 and the drain electrode 84 are directly in contact with the active layer 82 and are connected to the active layer 82 without a via), and orthographic projections of the source electrode 83 and the drain electrode 84 on the base substrate 10 are both located within an orthographic projection of the active layer 82 on the base substrate 10, thereby simplifying the manufacturing process for the thin film transistor 80. The manufacturing process for the thin film transistor 80 will be specifically described below, and will not be described herein before.

Figure 11:
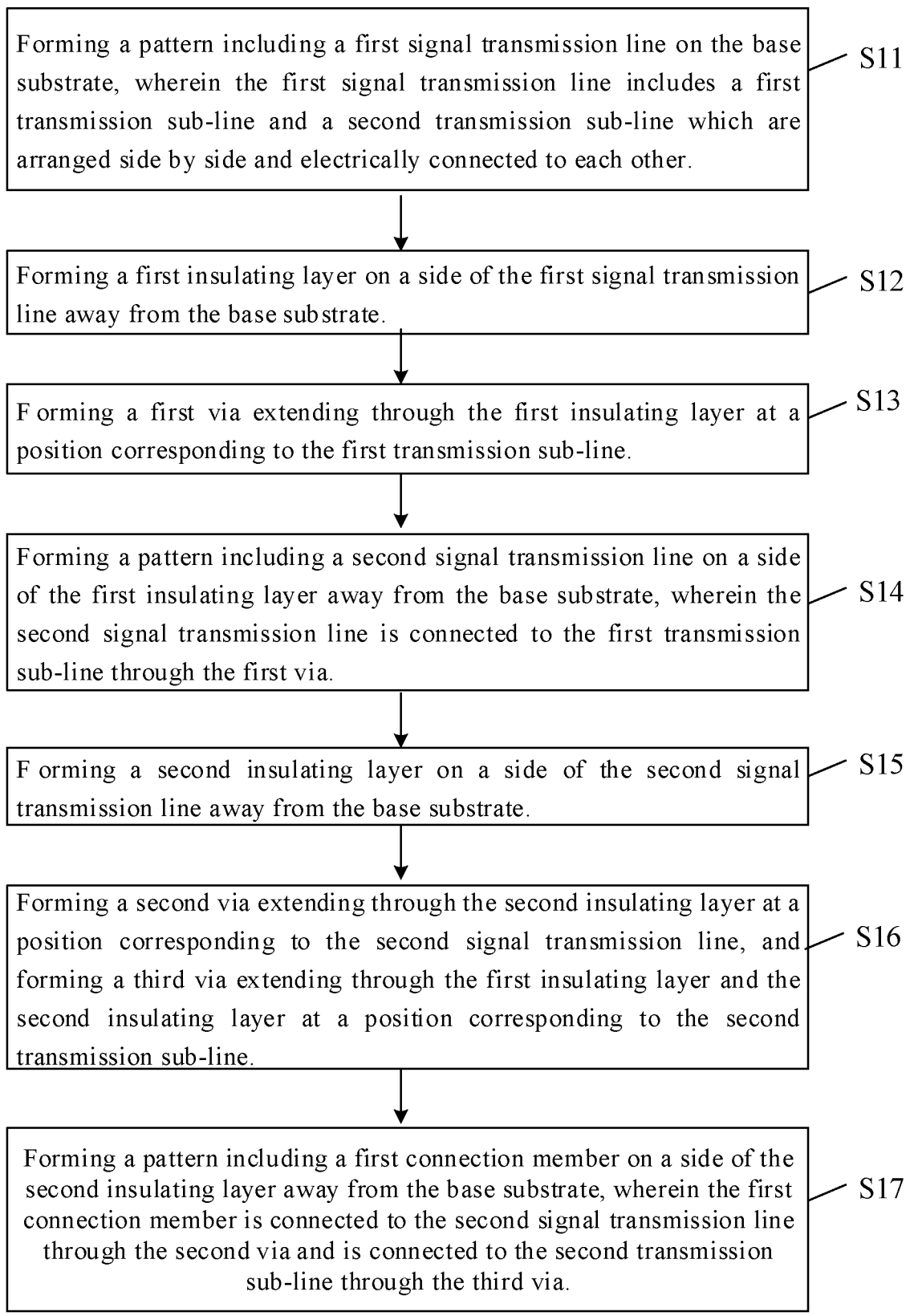
FIG. 11 is a flowchart of a method for manufacturing a display substrate according to some embodiments of the present disclosure.

The present disclosure further provides a method for manufacturing the above display substrate. FIG. 11 is a flowchart of a method for manufacturing a display substrate according to some embodiments of the present disclosure. As shown in FIG. 11, the method for manufacturing a display substrate includes:

S11, forming a pattern including a first signal transmission line on the base substrate, wherein the first signal transmission line includes a first transmission sub-line and a second transmission sub-line which are arranged side by side and electrically connected to each other.

S12, forming a first insulating layer on a side of the first signal transmission line away from the base substrate.

S13, forming a first via extending through the first insulating layer at a position corresponding to the first transmission sub-line.

S14, forming a pattern including a second signal transmission line on a side of the first insulating layer away from the base substrate, wherein the second signal transmission line is connected to the first transmission sub-line through the first via.

S15, forming a second insulating layer on a side of the second signal transmission line away from the base substrate.

S16, forming a second via extending through the second insulating layer at a position corresponding to the second signal transmission line, and forming a third via extending through the first insulating layer and the second insulating layer at a position corresponding to the second transmission sub-line.

S17, forming a pattern including a first connection member on a side of the second insulating layer away from the base substrate, wherein the first connection member is connected to the second signal transmission line through the second via and is connected to the second transmission sub-line through the third via.

In some embodiments, the first signal transmission line, the second signal transmission line and the first connection member are all located in the non-display region. In some embodiments, the method further includes: forming a thin film transistor in each sub-pixel in the display region, wherein a gate electrode of the thin film transistor is formed in synchronization with the first signal transmission line, the second signal transmission line, and the first connection member, and a source electrode, a drain electrode of the thin film transistor and the second signal transmission line are formed synchronously.

In some embodiments, the first insulating layer and the second insulating layer both cover the display region, and the method further includes: forming a pixel electrode in each sub-pixel before forming the first insulating layer. After the second insulating layer is formed, a fourth via extending through the second insulating layer and a fifth via extending through the first and second insulating layers are formed. A second connection member is formed, wherein the second connection member is connected to the drain electrode of the thin film transistor through the fourth via and is connected to the pixel electrode through the fifth via. The second connection member is formed in synchronization with the first connection member.

Figure 12:
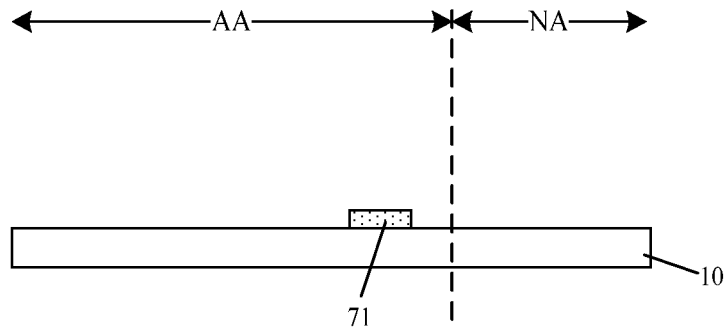
FIGS. 12 to 18 are schematic diagrams of a structure of a display substrate in a manufacturing process according to embodiments of the present disclosure.

FIGS. 12 to 19 are schematic diagrams of a structure of a display substrate in a manufacturing process according to embodiments of the present disclosure. The manufacturing process in FIGS. 12 to 19 is used for manufacturing the display substrate in FIG. 9. As shown in FIGS. 12 to 19, the method for manufacturing a display substrate includes following steps S20 to S28:

S20, as shown in FIG. 12, forming a plurality of pixel electrodes 71 on the base substrate 10, wherein one pixel electrode 71 is provided in each sub-pixel of the display region AA. The pixel electrodes 71 may be formed through a photolithographic patterning process, and the material of the pixel electrodes 71 may include a transparent conductive material such as ITO, and each pixel electrode 71 has a thickness between 500 Å and 900 Å, for example 700 Å.

Figure 13:
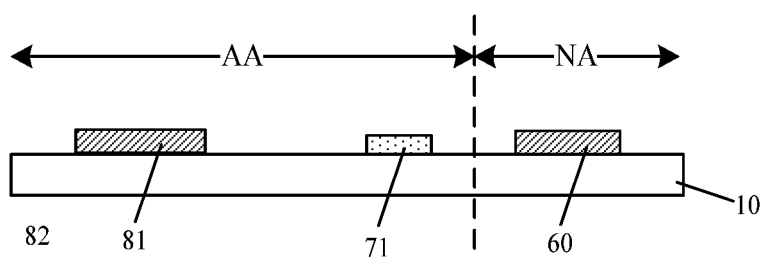

S21, as shown in FIG. 13, forming a first conductive pattern layer on the base substrate 10, wherein the first conductive pattern layer includes the gate electrode 81 of the thin film transistor 80 in each sub-pixel, and further includes a gate line GL, a common electrode line CL, and a first signal transmission line 60; and the first signal transmission line 60 includes: the first transmission sub-line and the second transmission sub-line arranged side by side, and the connection portion connected therebetween, and both the first transmission sub-line and the second transmission sub-line extend along the second direction.

Figure 14:
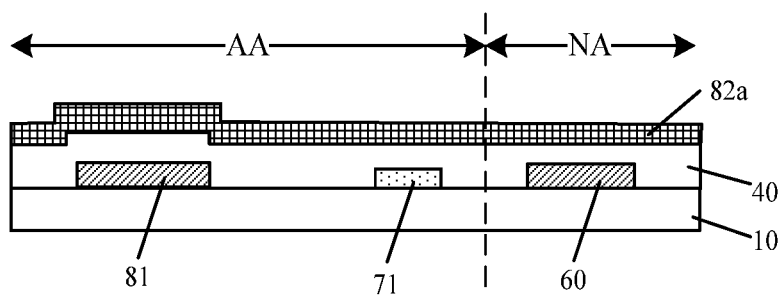

In one example, the first conductive pattern layer may be a laminate of Mo/Al/Mo. For example, Mo/Al/Mo have thicknesses of 150 Å/3000 Å/800 Å, respectively. S22, as shown in FIG. 14, sequentially forming the first insulating layer 40 and a semiconductor layer 82a. A material of the first insulating layer 40 may include at least one of silicon oxide, silicon nitride, and silicon oxynitride, and a thickness of the first insulating layer 40 may be between 1500 Å and 4000 Å, for example 4000 Å. A material of semiconductor layer 82a may include a-Si, and may have a thickness between 1000 Å and 2000 Å, such as 1700 Å.

Figure 15:
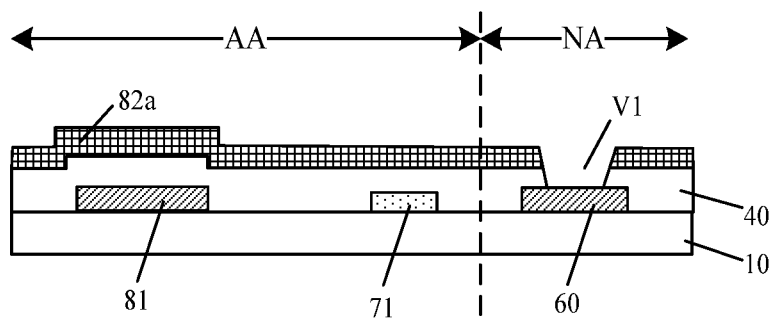

S23, as shown in FIG. 15, forming a first via V1.

Specifically, the step of forming the first via V1 may include S231 to S232:

S231, forming a photoresist layer on the semiconductor layer 82a, and exposing and developing the photoresist layer, to remove the photoresist in the region where the first via V1 is to be formed.

S232, etching the semiconductor layer 82a and the first insulating layer 40 to form the first via V1, wherein a portion of the semiconductor layer 82a corresponding to the first via V1 is also etched away after etching.

Figure 16:
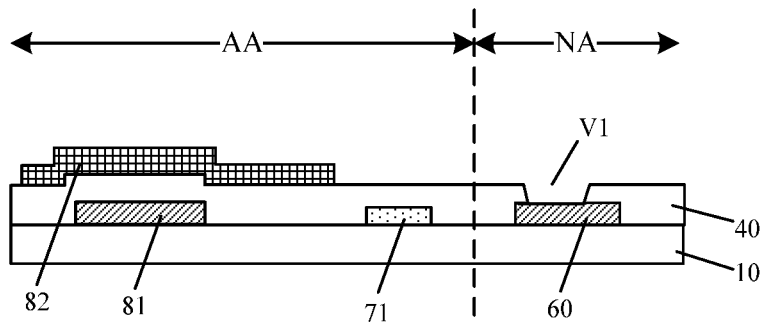

S24, as shown in FIG. 16, etching the semiconductor layer 82a again, to form the active layer 82 of the thin film transistor 80.

It should be noted that in step S22, only the first insulating layer 40 may be formed without forming the semiconductor layer, and in step S23, the photoresist layer is formed on the first insulating layer 40, and after the photoresist layer is exposed and developed, only the first insulating layer 40 is etched to form the first via V1. Then, the semiconductor layer 82 is formed and subjected to a patterning process to form the active layer 82.

Figure 17:
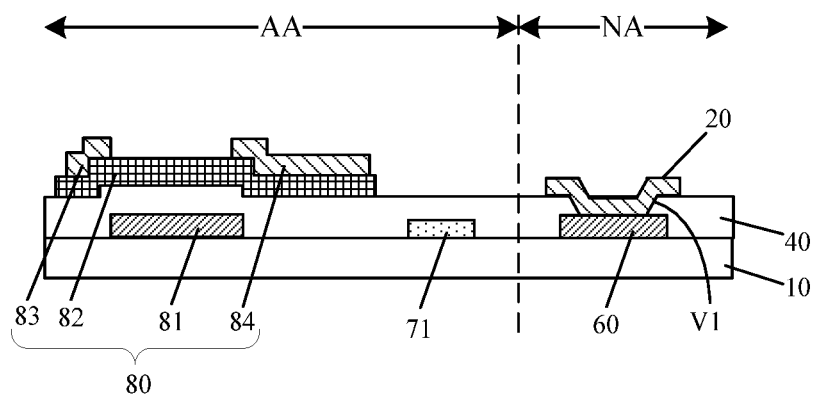

S25, forming a source-drain metal layer, and performing a patterning process on the source-drain metal layer to form a second conductive pattern layer, where the second conductive pattern layer includes the second signal transmission line 20, and the source electrode 83 and the drain electrode 84 of the thin film transistor 80, as shown in FIG. 17.

The source-drain metal layer may be a laminate of Mo/Al/Mo. Mo/Al/Mo have thicknesses of 150 Å/3000 Å/800 Å, respectively.

S26, forming a second insulating layer 50. A material of the second insulating layer 50 may include at least one of silicon nitride, silicon oxide, and silicon oxynitride, and the second insulating layer 50 may have a thickness between 1000 Å and 4000 Å, such as 3500 Å.

Figure 18:
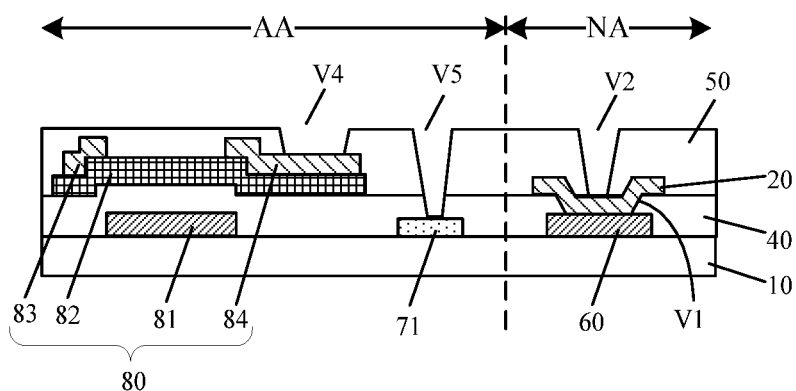

S27, as shown in FIG. 18, forming a second via V2 extending through the second insulating layer 50, a third via V3 extending through the first insulating layer 40 and the second insulating layer 50, a fourth via V4 extending through the second insulating layer 50, a fifth via V5 extending through the first insulating layer 40 and the second insulating layer 50, and a sixth via extending through the first insulating layer 40 and the second insulating layer 50, wherein an orthographic projection of the second via V2 on the base substrate 10 is located within an orthographic projection of the second signal transmission line 20 on the base substrate 10, an orthographic projection of the third via V3 on the base substrate 10 is located within an orthographic projection of the second transmission sub-line 62 on the base substrate 10, an orthographic projection of the fourth via V4 on the base substrate 10 is located within an orthographic projection of the drain electrode 84 of the thin-film transistor 80 on the base substrate 10, and an orthographic projection of the fifth via V5 on the base substrate 10 is located within an orthographic projection of the pixel electrode 71 on the base substrate 10. An orthographic projection of the sixth via on the base substrate 10 is located within an orthographic projection of the common electrode line CL on the base substrate 10.

Figure 19:
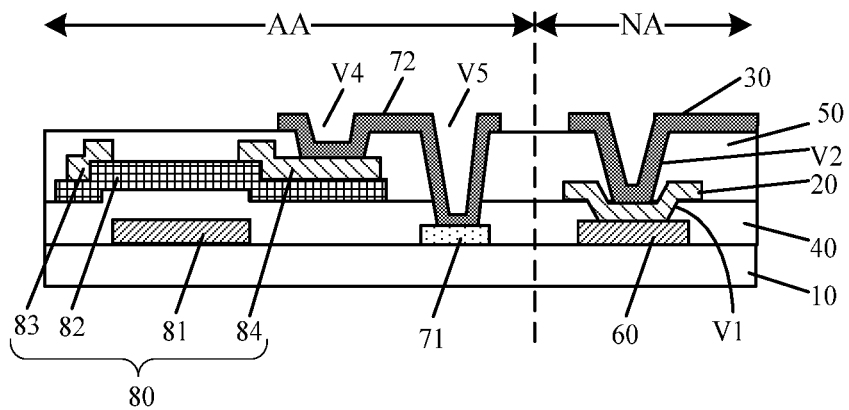
FIGS. 19 to 30 are schematic diagrams of a structure of a display substrate in a manufacturing process according to other embodiments of the present disclosure.

S28, as shown in FIG. 19, forming a pattern including the first connection member 30, the second connection member 72, and the common electrode. The first connection member 30 is connected to the second signal transmission line 20 through the second via V2, and is connected to the second transmission sub-line 62 through the third via V3; the second connection member 72 is connected to the drain electrode 84 of the thin film transistor 80 through the fourth via V4 and is connected to the pixel electrode 71 through the fifth via V5. The common electrode may be connected to the common electrode line through the sixth via.

Figure 20:
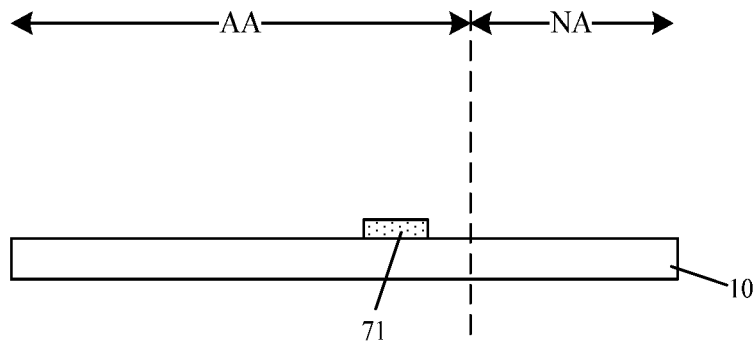

FIGS. 20 to 30 are schematic diagrams of a structure of a display substrate in a manufacturing process according to other embodiments of the present disclosure. The manufacturing process of FIGS. 20 to 30 is used to manufacture the display substrate in FIG. 10. As shown in FIGS. 20 to 30, the method for manufacturing a display substrate includes:

S30, as shown in FIG. 20, forming a plurality of pixel electrodes 71 on the base substrate 10. The step S30 may be the same as the step S20, and is not repeated herein.

Figure 21:
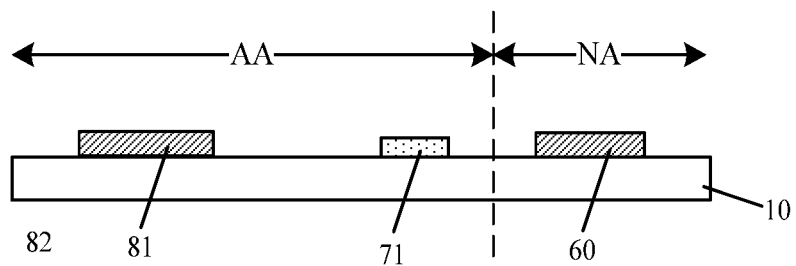

S31, as shown in FIG. 21, forming a first conductive pattern layer on the base substrate 10, wherein the first conductive pattern layer includes the gate electrode 81 of the thin film transistor 80 in each sub-pixel, and further includes a gate line GL, a common electrode line CL, and a first signal transmission line 60; and the first signal transmission line 60 includes: the first transmission sub-line 61 and the second transmission sub-line 62 arranged side by side, and the connection portion connected therebetween, and both the first transmission sub-line 61 and the second transmission sub-line 62 extend along the second direction. The step S31 may be the same as step S21, and will not be described here.

Figure 22:
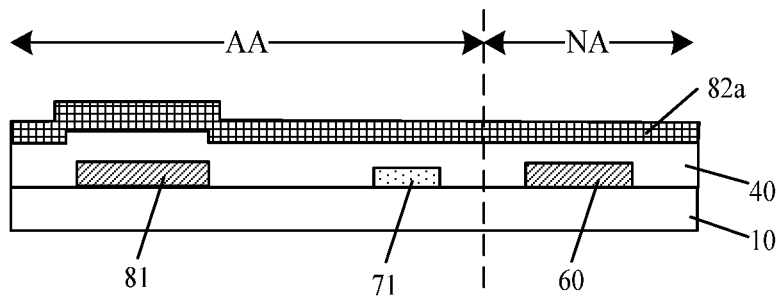

S32, as shown in FIG. 22, sequentially forming the first insulating layer 40 and a semiconductor layer 82a. A material of the first insulating layer 40 may include at least one of silicon oxide, silicon nitride, and silicon oxynitride, and a thickness of the first insulating layer 40 may be between 1500 Å and 4000 Å, for example 4000 Å. A material of semiconductor layer 82a may include a-Si, and may have a thickness between 1000 Å and 2000 Å, such as 1700 Å.

Figure 23:
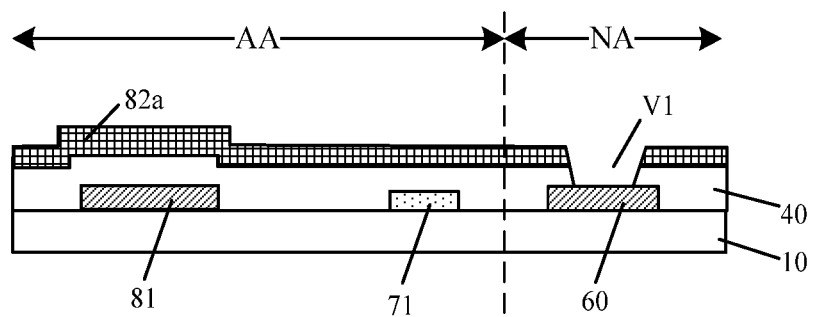

S33, as shown in FIG. 23, forming a first via V1.

Specifically, the step of forming the first via V1 may include S331 to S332:

S331, forming a photoresist layer on the semiconductor layer 82a, and exposing and developing the photoresist layer, to remove the photoresist in the region where the first via V1 is to be formed.

S332, etching the semiconductor layer 82a and the first insulating layer 40 to form the first via V1, wherein a portion of the semiconductor layer 82a corresponding to the first via V1 is also etched away after etching.

Figure 24:
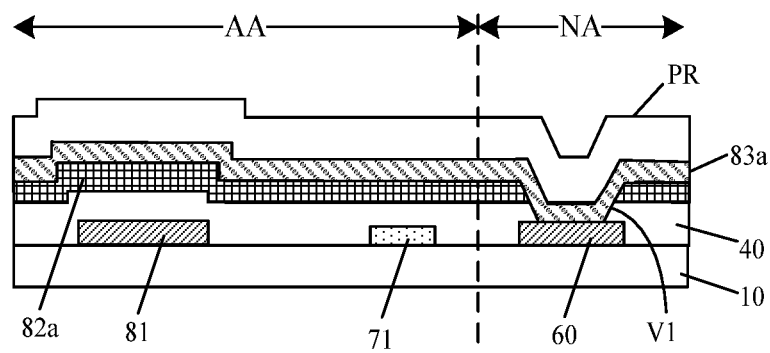

S34, synchronously forming the second signal transmission line 20 and a source electrode 83, a drain electrode 84 and an active layer 82 of the thin film transistor 80. Specifically, the step S34 may include steps S341 to S345:

S341, as shown in FIG. 24, sequentially forming a source-drain metal layer 83a and a photoresist layer PR on a side of the semiconductor layer away from the base substrate 10. The source-drain metal layer 83a may be a laminate of Mo/Al/Mo. Mo/Al/Mo have thicknesses of 150 Å/3000 Å/800 Å, respectively.

Figure 25:
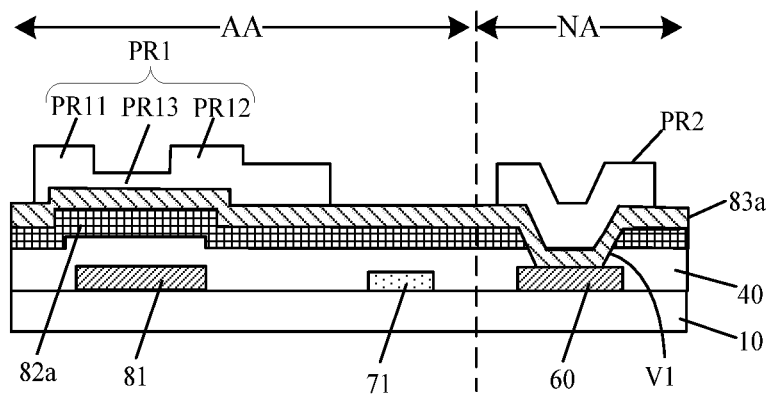

S342, as shown in FIG. 25, performing an exposure process of a trapezoidal pattern for the photoresist layer PR and then performing a development process on the exposed photoresist layer to form a photoresist pattern, wherein the photoresist layer PR includes at least a first photoresist portion PR1 in each sub-pixel, the first photoresist portion PR1 is located in a region where the active layer 82 is located and includes: a first portion PR11 corresponding to the source electrode 83, a second portion PR12 corresponding to the drain electrode 84, and a third portion PR13 located between the first portion PR11 and the second portion PR12; the first and second portions PR11 and PR12 of the first photoresist portion PR1 each have a thickness greater than that of the third portion PR13. A portion of the photoresist layer PR outside the region where the active layer 82 is located may be removed in each sub-pixel.

When exposing the photoresist layer PR, the photoresist layer PR may be exposed to form a trapezoidal pattern by using a half-tone mask.

In addition, after the performing an exposure process of a trapezoidal pattern for the photoresist layer PR and then performing a development process on the exposed photoresist layer, the formed pattern may further include a second photoresist portion PR2 and a third photoresist portion, the second photoresist portion PR2 is located in a region where the second signal transmission line 20 is to be formed, and the third photoresist portion is located in a region where the data lines DL are to be formed. Each of thicknesses of the second photoresist portion PR2 and the third photoresist portion is greater than that of the third portion PR13 of the first photoresist portion PR1.

Figure 26:
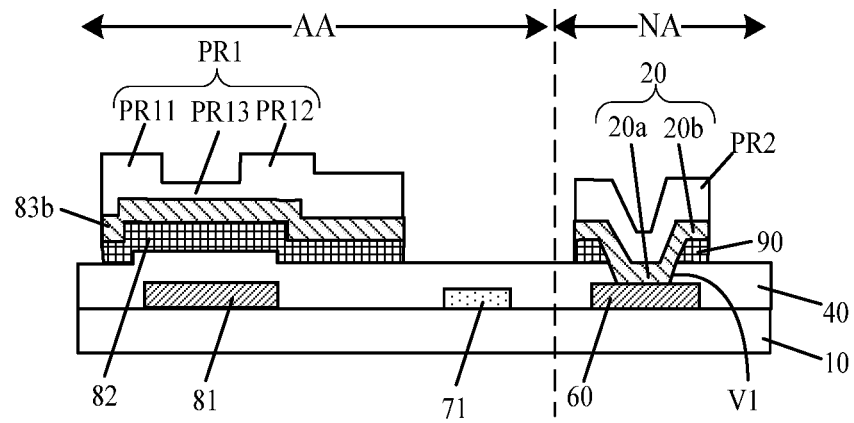

S343, as shown in FIG. 26, etching the source-drain metal layer 83a and the semiconductor layer 82a, so that portions of the source-drain metal layer 83a and the semiconductor layer 82a not covered by the photoresist pattern are etched away, to form the active layer 82 and an intermediate electrode 83b corresponding to the first photoresist portion PR1, the second signal transmission line 20 and a semiconductor redundant portion 90 corresponding to the second photoresist portion PR2, and the data lines and a semiconductor redundant portion corresponding to the third photoresist portion.

The second signal transmission line 20 is connected to the first transmission sub-line 61 through the first via V1, and includes a portion located inside the first via V1 and a lap portion located outside the first via V1; an orthographic projection of the lap portion on the base substrate 10 is located outside an orthographic projection of the first via V1 on the base substrate 10, and the semiconductor redundant portion 90 is located between the lap portion 20b and the first insulating layer 40.

Figure 27:
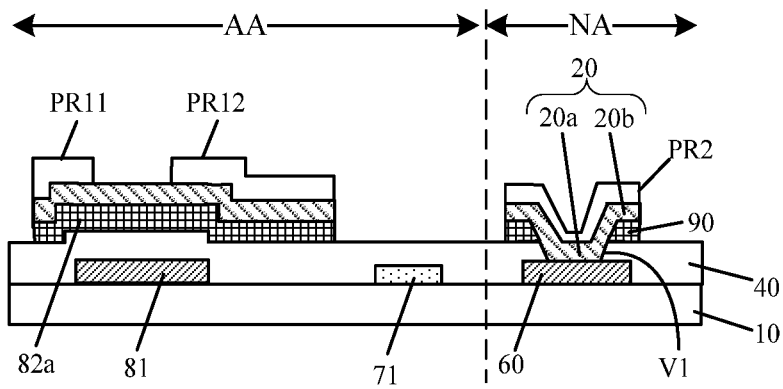

S344, as shown in FIG. 27, ashing the first and second photoresist portions PR1 and PR2, to thin the first and second portions PR11 and PR12 of the first photoresist portion PR1 and the second photoresist portion PR2 and to remove the third portion PR13 of the first photoresist portion PR1.

Figure 28:
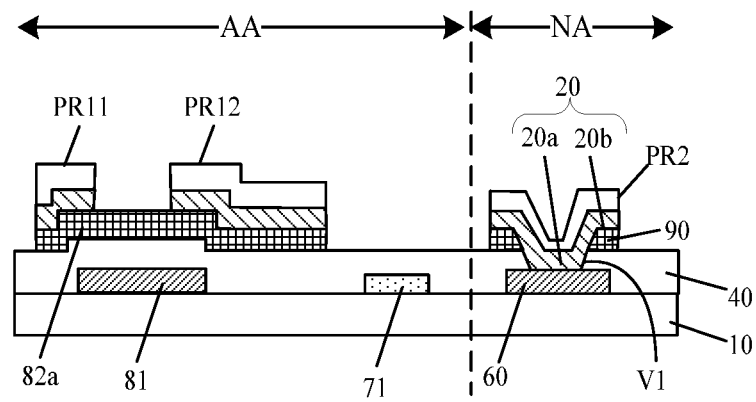

S345, as shown in FIG. 28, etching the intermediate electrode 83b, to form the source electrode 83 and the drain electrode 84.

Then, the residual photoresist is removed.

In the step S34, the second signal transmission line 20 and the source electrode 83, the drain electrode 84 and the active layer 82 of the thin film transistor 80 may be formed by using the same photolithographic patterning process, so that the manufacturing process is simplified and the process cost is reduced.

S35, forming a second insulating layer 50. A material of the second insulating layer 50 may include at least one of silicon nitride, silicon oxide, and silicon oxynitride, and the second insulating layer 50 may have a thickness between 1000 Å and 4000 Å, such as 3500 Å.

Figure 29:
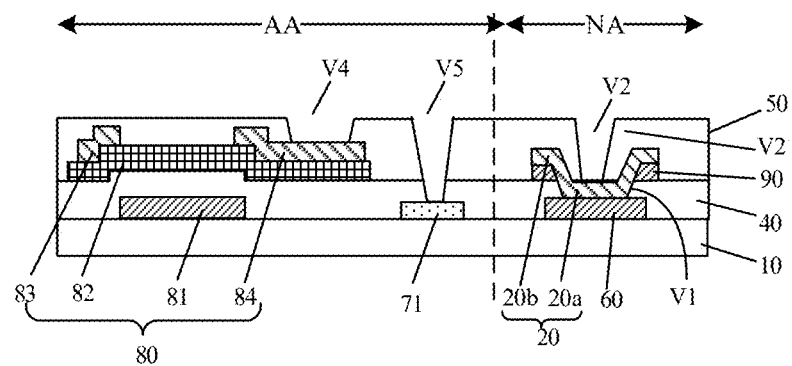

S36, as shown in FIG. 29, forming a second via V2 extending through the second insulating layer 50, a third via V3 extending through the first insulating layer 40 and the second insulating layer 50, a fourth via extending through the second insulating layer 50, a fifth via extending through the first insulating layer 40 and the second insulating layer 50, and a sixth via extending through the first insulating layer 40 and the second insulating layer 50, wherein an orthographic projection of the second via V2 on the base substrate 10 is located within an orthographic projection of the second signal transmission line 20 on the base substrate 10, an orthographic projection of the third via V3 on the base substrate 10 is located within an orthographic projection of the second transmission sub-line 62 on the base substrate 10, an orthographic projection of the fourth via on the base substrate 10 is located within an orthographic projection of the drain electrode 84 of the thin-film transistor 80 on the base substrate 10, and an orthographic projection of the fifth via on the base substrate 10 is located within an orthographic projection of the pixel electrode 71 on the base substrate 10. An orthographic projection of the sixth via on the base substrate 10 is located within an orthographic projection of the common electrode line CL on the base substrate 10.

Figure 30:
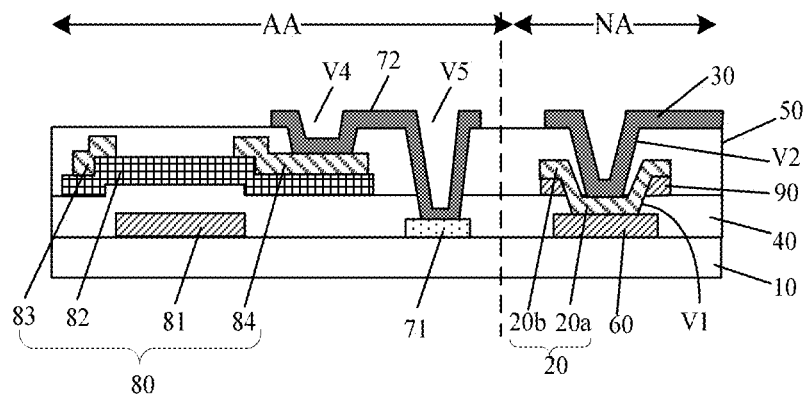

S37, as shown in FIG. 30, forming a pattern including the first connection member 30, the second connection member 72 and the common electrode 70. The first connection member 30 is connected to the second signal transmission line 20 through the second via V2, and is connected to the second transmission sub-line 62 through the third via V3; the second connection member 72 is connected to the drain electrode 84 of the thin film transistor 80 through the fourth via and is connected to the pixel electrode 71 through the fifth via. The common electrode 70 may be connected to the common electrode line CL through the sixth via.

The embodiments of the present disclosure further provide a display device, which includes the display substrate in the above embodiment. The display device may be: any product or component with a display function, such as electronic paper, a mobile phone, a tablet computer, a television, a display, a notebook computer, a digital photo frame, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising:
   a base substrate;
   a first signal transmission line on the base substrate and comprising a first transmission sub-line and a second transmission sub-line side by side in a same layer and electrically connected to each other;
   a first insulating layer on a side of the first signal transmission line away from the base substrate;
   a second signal transmission line on a side of the first insulating layer away from the base substrate and being in direct contact with the first transmission sub-line through a first via extending through the first insulating layer;
   a second insulating layer on a side of the second signal transmission line away from the base substrate; and
   a first connection member on a side of the second insulating layer away from the base substrate, connected to the second signal transmission line through a second via extending through the second insulating layer and connected to the second transmission sub-line through a third via extending through the first insulating layer and the second insulating layer.

2. The display substrate of claim 1, wherein an orthographic projection of the second via on the base substrate is within an orthographic projection of the first via on the base substrate.

3. The display substrate of claim 1, wherein an orthographic projection of the first via on the base substrate is within an orthographic projection of the second signal transmission line on the base substrate.

4. The display substrate of claim 3, wherein the second signal transmission line comprises: a conductive portion and a transmission portion connected to the conductive portion; the conductive portion extends along a length direction of the first transmission sub-line, and an extending direction of the transmission portion intersects with an extending direction of the conductive portion; the orthographic projection of the first via on the base substrate is within an orthographic projection of the conductive portion on the base substrate; and
   a size of the first via in a width direction of the conductive portion is 0.4 to 0.6 times of a width of the conductive portion, and a size of the second via in the width direction of the conductive portion is 0.2 to 0.5 times of the width of the conductive portion.

5. The display substrate of claim 3, wherein the first connection member comprises: a first connection portion, a second connection portion, and a first climbing portion connected between the first connection portion and the second connection portion, the first connection portion is opposite to the second signal transmission line, an orthographic projection of the second connection portion on the base substrate is opposite to a spacing region between the first transmission sub-line and the second transmission sub-line, the first connection portion comprises: a first lap portion and a second climbing portion; the second climbing portion is inside the second via; the first lap portion is outside the second via and connects the first climbing portion with the second climbing portion; and
   a slope angle of the first climbing portion is between 35° and 64°; a slope angle of the second climbing portion is between 35° and 62°.

6. The display substrate of claim 3, wherein a depth of the first via is between 1500 Å and 4000 Å, a depth of the second via is between 3000 Å and 8000 Å, and a depth of the third via is between 3000 Å and 8000 Å.

7. The display substrate of claim 1, wherein the second signal transmission line comprises: a conductive portion and a transmission portion connected to the conductive portion; the conductive portion extends along a length direction of the first transmission sub-line, and an extending direction of the transmission portion intersects with an extending direction of the conductive portion; and
   an orthographic projection of the first via on the base substrate is a first projection, and an orthographic projection of the conductive portion on the base substrate is a second projection; and a part of the first projection exceeds the second projection and is on a side of the second projection close to the second transmission sub-line.

8. The display substrate of claim 7, wherein the first connection member comprises a first connection portion, a second connection portion, and a first climbing portion connected between the first connection portion and the second connection portion, the first connection portion is opposite to the second signal transmission line, an orthographic projection of the second connection portion on the base substrate is opposite to a spacing region between the first transmission sub-line and the second transmission sub-line, the first connection portion comprises: a first lap portion and a second climbing portion; the second climbing portion is inside the second via; the first lap portion is outside the second via and connects the first climbing portion with the second climbing portion; and
   a slope angle of the first climbing portion is between 20° and 45°; a slope angle of the second climbing portion is between 20° and 42°.

9. The display substrate of claim 7, wherein a depth of the first via is between 1500 Å and 4000 Å, a depth of the second via is between 1500 Å and 4000 Å, and a depth of the third via is between 3000 Å and 8000 Å.

10. The display substrate of claim 7, wherein a size of the first via in a width direction of the conductive portion is 0.4 to 0.6 times of a width of the conductive portion, and a size of the second via in the width direction of the conductive portion is 0.7 to 1.1 times of the width of the conductive portion.

11. The display substrate of claim 1, wherein a cross-sectional area of the first via and a cross-sectional area of the second via each gradually decrease in a direction approaching the base substrate; and a slope angle of a wall of the first via is smaller than that of a wall of the second via.

12. The display substrate of claim 1, wherein the second insulating layer has a thickness between 1000 Å and 4000 Å.

13. The display substrate of claim 1, wherein the display substrate comprises a plurality of first connection members and a plurality of second signal transmission lines; the first signal transmission line is connected to the plurality of first connection members; each first connection member is connected to one second signal transmission line through a plurality of second vias and is connected to the second transmission sub-line through a plurality of third vias; the plurality of third vias corresponding to a same first connection member are arranged along an extending direction of the first signal transmission line, and the plurality of second vias corresponding to a same first connection member are arranged along the extending direction of the first signal transmission line.

14. The display substrate of claim 13, wherein an orthographic projection of the plurality of second vias corresponding to a same first connection member on the base substrate is within an orthographic projection of a corresponding first via on the base substrate.

15. The display substrate of claim 1, wherein the display substrate comprises a display region and a non-display region, the display region comprises a plurality of sub-pixels, each of which is provided with a thin film transistor therein; and the first signal transmission line, the second signal transmission line and the first connection member are all in the non-display region, the first signal transmission line and a gate electrode of the thin film transistor are in a same layer, and the second signal transmission line and a source electrode and a drain electrode of the thin film transistor are in a same layer.

16. The display substrate of claim 15, wherein each of the plurality of sub-pixels is further provided with a pixel electrode and a second connection member, the first insulating layer and the second insulating layer both cover the display region, the pixel electrode is between the first insulating layer and the base substrate, the second connection member is on a side of the second insulating layer away from the base substrate and is connected to the drain electrode of the thin film transistor through a fourth via extending through the second insulating layer and is connected to the pixel electrode through a fifth via extending through the first insulating layer and the second insulating layer, and the second connection member and the first connection member are in a same layer.

17. The display substrate of claim 15, wherein the source electrode and the drain electrode of the thin film transistor are on a side of an active layer of the thin film transistor away from the base substrate, and are both in direct contact with the active layer; and orthographic projections of the source electrode and the drain electrode on the base substrate are both within an orthographic projection of the active layer on the base substrate.

18. The display substrate of claim 15, wherein the second signal transmission line comprises a lap portion; an orthographic projection of the lap portion on the base substrate is outside an orthographic projection of the first via on the base substrate, and the display substrate further comprises a semiconductor redundant portion between the first insulating layer and the lap portion; the semiconductor redundant portion is formed in synchronization with the active layer of the thin film transistor.

19. The display substrate of claim 1, wherein the display substrate comprises a display region and a non-display region; the first signal transmission line and the second signal transmission line are both in the non-display region; and the display substrate further comprises a plurality of shift register units in the non-display region; and the first signal transmission line is a clock signal line; the display substrate comprises a plurality of second signal transmission lines, each of which is connected between the first signal transmission line and one shift register unit, and different second signal transmission lines are connected to different shift register units; and wherein the first signal transmission line further comprises a plurality of connection portions connected between the first transmission sub-line and the second transmission sub-line.

20. A display device, comprising the display substrate of claim 1.

* * * * *